United States Patent
Tanaka et al.

(10) Patent No.: US 9,591,750 B2
(45) Date of Patent: Mar. 7, 2017

(54) WIRING SUBSTRATE AND SEMICONDUCTOR DEVICE

(71) Applicant: SHINKO ELECTRIC INDUSTRIES CO., LTD., Nagano-ken (JP)

(72) Inventors: Masato Tanaka, Nagano (JP); Shoji Watanabe, Nagano (JP); Noriyoshi Shimizu, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 117 days.

(21) Appl. No.: 14/548,568

(22) Filed: Nov. 20, 2014

(65) Prior Publication Data
US 2015/0181703 A1    Jun. 25, 2015

(30) Foreign Application Priority Data

Dec. 20, 2013 (JP) ................................. 2013-264671

(51) Int. Cl.
*H05K 1/02* (2006.01)
*H05K 1/11* (2006.01)
(Continued)

(52) U.S. Cl.
CPC ......... *H05K 1/0298* (2013.01); *H01L 23/145* (2013.01); *H05K 3/4644* (2013.01); *H01L 23/49822* (2013.01); *H01L 23/49827* (2013.01); *H01L 2224/16225* (2013.01); *H01L 2924/15174* (2013.01); *H01L 2924/15311* (2013.01); *H05K 2201/029* (2013.01);
(Continued)

(58) Field of Classification Search
CPC ... H05K 1/0298; H05K 3/4644; H01L 23/145
See application file for complete search history.

(56) References Cited

U.S. PATENT DOCUMENTS 8,097,946 B2 * 1/2012 Saitou .................. H01L 23/145
174/256
8,153,909 B2 * 4/2012 Katagiri ............... H05K 3/0035
174/258

(Continued)

FOREIGN PATENT DOCUMENTS

JP    2003-023252    1/2003
JP    2003-023253    1/2003

*Primary Examiner* — William H Mayo, III
*Assistant Examiner* — Hiram E Gonzalez
(74) *Attorney, Agent, or Firm* — Fish & Richardson P.C.

(57) ABSTRACT

A wiring substrate includes first and second wiring structures. The first wiring structure includes a core substrate, first and second insulation layers formed from a thermosetting insulative resin respectively including first and second reinforcement materials, and a via wire formed in the first insulation layer. The second wiring structure includes a third insulation layer formed on an upper surface of the first insulation layer and an upper end surface of the via wire, and a wiring layer extended through the third insulation layer and electrically connected to the via wire. The outermost insulation layer, the main component of which is a photosensitive resin, is stacked on a lower surface of the second insulation layer. The second wiring structure has a higher wiring density than the first wiring structure. The first reinforcement material is partially exposed on the upper surface of the first insulation layer.

15 Claims, 10 Drawing Sheets

(51) Int. Cl.
*H05K 1/18* (2006.01)
*H05K 3/46* (2006.01)
*H01L 23/14* (2006.01)
*H01L 23/498* (2006.01)

(52) U.S. Cl.
CPC ............ *H05K 2201/09227* (2013.01); *H05K 2201/10674* (2013.01); *H05K 2203/025* (2013.01)

(56) References Cited

U.S. PATENT DOCUMENTS

| | | | | |
|---|---|---|---|---|
| 8,692,364 | B2* | 4/2014 | Kikuchi | H01L 23/49827 257/678 |
| 2008/0296056 | A1* | 12/2008 | Kinoshita | H01L 23/13 174/261 |
| 2012/0012247 | A1* | 1/2012 | Sohn | B29C 66/73116 156/252 |
| 2012/0111624 | A1* | 5/2012 | Maeda | H05K 3/4682 174/261 |
| 2012/0217607 | A1* | 8/2012 | Hanai | H01L 27/14618 257/448 |
| 2012/0306608 | A1* | 12/2012 | Takenaka | H05K 1/165 336/200 |
| 2015/0114699 | A1* | 4/2015 | Ko | H05K 3/427 174/258 |

\* cited by examiner

WIRING SUBSTRATE AND SEMICONDUCTOR DEVICE

CROSS-REFERENCE TO RELATED APPLICATIONS

This application is based upon and claims the benefit of priority from prior Japanese Patent Application No. 2013-264671, filed on Dec. 20, 2013, the entire contents of which are incorporated herein by reference.

FIELD

This disclosure relates to a wiring substrate, a semiconductor device, and a method for manufacturing a wiring substrate.

BACKGROUND

Conventionally, a build-up wiring substrate is known as a wiring substrate used for a semiconductor package and the like. Japanese Laid-Open Patent Publication No. 2003-023252 and Japanese Laid-Open Patent Publication No. 2003-023253 describe conventional examples of a build-up wiring substrate. In these patent publications, a wiring layer and an insulation layer are stacked on each of upper and lower surfaces of a core substrate to increase the density of wiring patterns.

In recent years, electronic components, such as a semiconductor chip mounted on a build-up wiring substrate, are further increased in density while being reduced in size. The build-up wiring substrate needs denser and finer wiring patterns and smaller and thinner wiring substrates.

SUMMARY

When a core substrate is thinned so that the build-up wiring substrate is thinned, the mechanical strength of the core substrate decreases. In recent years, as the number of terminals of a semiconductor chip increases, the number of through electrodes, which extend through the core substrate in the thicknesswise direction, increases. When the number of through electrodes increases, a larger amount of a reinforcement material arranged in the core substrate is split. This lowers mechanical strength of the core substrate. When the mechanical strength of the core substrate is lowered, the rigidity of the build-up wiring substrate is lowered. This tends to generate warpage in the wiring substrate.

In one aspect of this disclosure, a wiring substrate includes a first wiring structure, a second insulation layer, and an insulation layer. The first wiring structure includes a core substrate, a first insulation layer stacked on an upper surface of the core substrate and formed from a thermosetting insulative resin including a first reinforcement material, a second insulation layer stacked on a lower surface of the core substrate and formed from a thermosetting insulative resin including a second reinforcement material, and a via wire formed in the first insulation layer. The second wiring structure includes a third insulation layer formed on an upper surface of the first insulation layer and an upper end surface of the via wire, and a wiring layer formed on the third insulation layer. The main component of the third insulation layer is a photosensitive resin. The wiring layer extends through the third insulation layer to be electrically connected to the upper end surface of the via wire. The outermost insulation layer is stacked on a lower surface of the second insulation layer. The main component of the outermost insulation layer is a photosensitive resin. The second wiring structure has a higher wiring density than the first wiring structure. The first reinforcement material of the first insulation layer is partially exposed on the upper surface of the first insulation layer.

In another aspect of this disclosure, a method for manufacturing a wiring substrate includes preparing a core substrate, stacking a first insulation layer, which is formed from a thermosetting insulative resin including a first reinforcement material, on an upper surface of the core substrate, stacking a second insulation layer, which is formed from a thermosetting insulative resin including a second reinforcement material, on a lower surface of the core substrate, forming a first through hole that extends through the first insulation layer in a thicknesswise direction, forming a conductive layer that fills the first through hole and covers an upper surface of the first insulation layer, polishing the conductive layer and the upper surface of the first insulation layer so that the first reinforcement material is exposed on the upper surface of the first insulation layer and so that a via wire, which includes an upper end surface exposed on the upper surface of the first insulation layer, is formed in the first through hole, stacking a second wiring structure, which includes a third insulation layer, the main component of which is a photosensitive resin, and a wiring layer, on the upper surface of the first insulation layer, and stacking an outermost insulation layer, the main component of which is a photosensitive resin, on a lower surface of the second insulation layer.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 4C is a partial enlarged cross-sectional view of a structure illustrated in FIG. 4B, FIG. 5B is a partial enlarged cross-sectional view of a structure illustrated in FIG. 5A, FIG. 6B is a partial enlarged cross-sectional view of a structure illustrated in FIG. 6A, FIG. 6D is a partial enlarged cross-sectional view of a structure illustrated in FIG. 6C, FIG. 8B is a partial enlarged cross-sectional view of a structure illustrated in FIG. 8A, and FIG. 9B is a partial enlarged cross-sectional view of a structure illustrated in FIG. 9A;

DESCRIPTION OF THE EMBODIMENTS

Figure 1A:
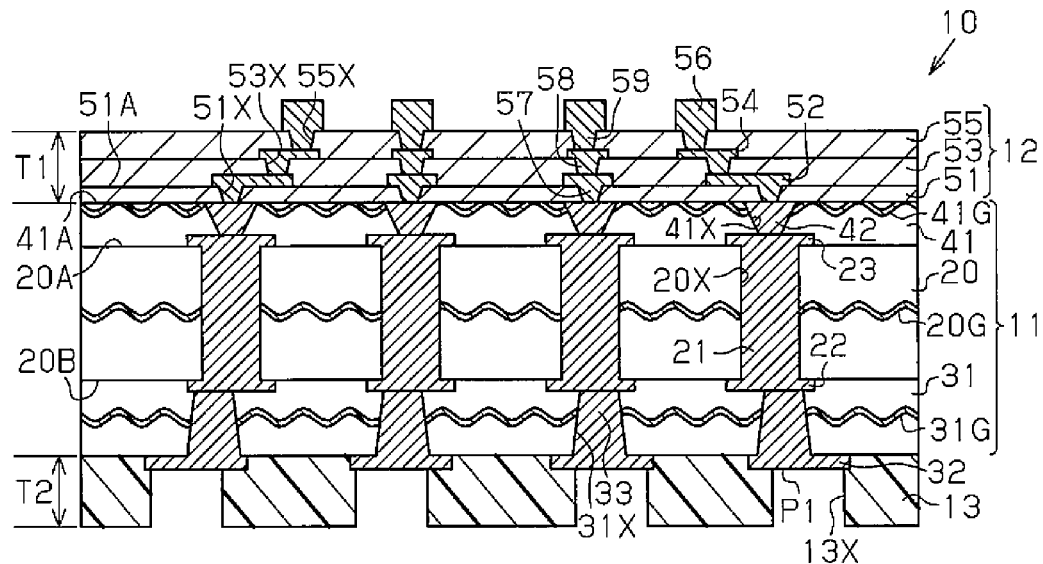
FIG. 1A is a schematic cross-sectional view illustrating a wiring substrate of one embodiment.

Various embodiments will now be described with reference to the accompanying drawings. Elements in the drawings are illustrated for simplicity and clarity and have not necessarily been drawn to scale. In the cross-sectional views, hatching of some elements is omitted and the hatching of some elements is changed to be shaded for clarity.

As illustrated in FIG. 1A, a wiring substrate 10 includes a wiring structure 11, a wiring structure 12 stacked on one side (here, upper side) of the wiring structure 11, and a solder resist layer 13 stacked on the other side (here, lower side) of the wiring structure 11. The wiring substrate 10 may have any shape and size as viewed from above. For example, the wiring substrate 10 may be a square with sides of approximately 40 mm as viewed from above.

The structure of the wiring structure 11 will now be described.

The wiring structure 11 is a low-density wiring layer, which includes a wiring layer with wiring density lower than that of the wiring structure 12. The wiring structure 11 includes a core substrate 20, an insulation layer 31 stacked on a lower surface 20B of the core substrate 20, and an insulation layer 41 stacked on an upper surface 20A of the core substrate 20.

For example, a thermosetting insulative resin including a reinforcement material may be used as the material of the core substrate 20 and the insulation layers 31 and 41. For example, a glass epoxy resin may be used as the material of the core substrate 20 and the insulation layers 31 and 41. A glass epoxy resin is obtained by impregnating a thermosetting insulative resin, the main component of which is an epoxy resin, in a glass cloth (glass woven cloth) as a reinforcement material and curing the resin. The thermosetting insulative resin is not limited to an epoxy resin. For example, a polyimide resin or a cyanate resin may be used. The core substrate 20 and the insulation layers 31 and 41 may include, for example, a filler such as silica or alumina.

The core substrate 20 includes a predetermined number one in FIG. 1A) of a glass cloth 20G. The insulation layer 31 includes a predetermined number (one in FIG. 1A) of a glass cloth 31G. The insulation layer 41 includes a predetermined number (one in FIG. 1A) of a glass cloth 41G.

Figure 1B:
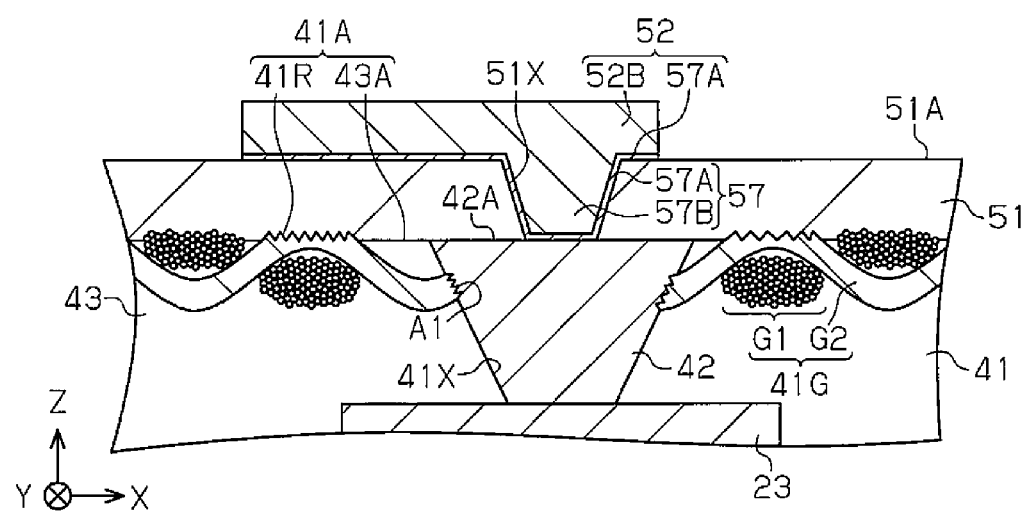
FIG. 1B is a partial enlarged cross-sectional view of the wiring substrate of FIG. 1A.
Figure 2:
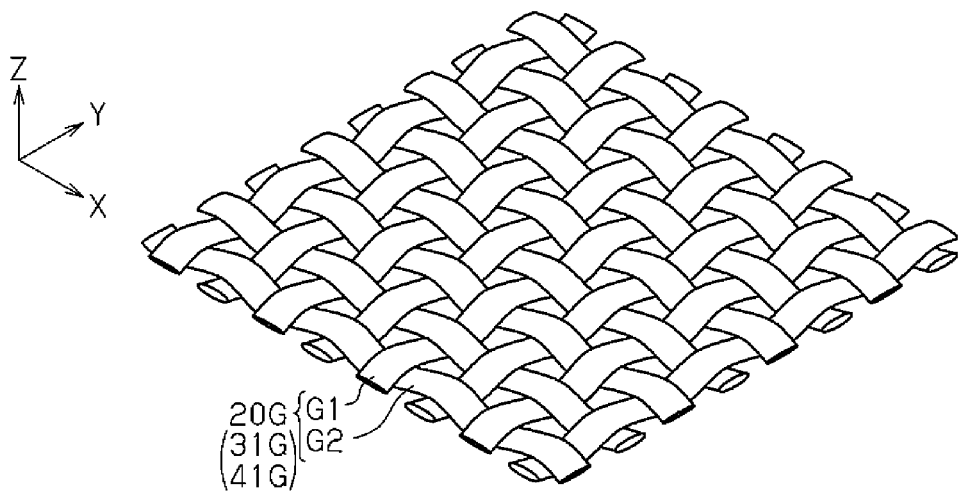
FIG. 2 is a schematic perspective view illustrating one example of a glass cloth.

As illustrated in FIG. 2, for example, the glass clothes 20G, 31G, and 41G each have a structure in which glass fiber bundles G1 arranged side by side in the X direction and glass fiber bundles G2 arranged side by side in the Y direction are plain woven to a lattice-form. As illustrated in FIG. 1B, the glass fiber bundles G1 and G2 are each obtained by bundling a plurality of glass fibers. The diameter of each glass fiber is, for example, approximately 1 to 2 μm. The thickness of each glass fiber bundle G1 and G2 may be, for example, approximately 15 to 20 μm. Although, in FIG. 1B, the glass fibers of the glass fiber bundle G1 are illustrated, in enlarged cross-sectional views of FIGS. 4C, 5B, 6B, 6D, 8B, and 9B, the glass fibers are not illustrated. Instead, a cross-sectional shape of the glass fiber bundle G1 is indicated by an elliptic shape. The entire cross-sectional shape of each glass fiber bundle G1 and G2 including the glass fibers is not particularly limited, and, for example, may be elliptic or circular.

Instead of the glass clothes 20G, 31G, and 41G using the glass fiber bundles G1 and G2, woven cloth or non-woven cloth using carbon fiber bundle, polyester fiber bundle, nylon fiber bundle, aramid fiber bundle, liquid crystal polymer fiber bundle, and the like may be used for the reinforcement material. The weaving manner of the fiber bundles is not limited to plain weaving, and may be sateen weaving, twill weaving, and the like.

As illustrated in FIG. 1A, the core substrate 20 is arranged in the middle of the wiring structure 11 in the thicknesswise direction. The thickness of the core substrate 20 may be, for example, approximately 80 to 400 μm. The glass cloth 20G is arranged in the middle of the core substrate 20 in the thicknesswise direction.

Through holes 20X are formed in predetermined locations (four locations, in FIG. 1A) of the core substrate 20. The through hole 20X extends through the core substrate 20 from the upper surface 20A to the lower surface 20B. The through hole 20X splits the glass cloth 20G. A through electrode 21, which extends through the core substrate 20 in the thicknesswise direction, is formed in the through hole 20X. That is, the through hole 20X is filled with the through electrode 21. Although the illustration is omitted, the through hole 20X and the through electrode 21 each have, for example, a circular shape as viewed from above. The diameter of the through hole 20X and the through electrode 21 may be, for example, approximately 100 to 200 μm. The pitch of the through hole 20X and the pitch of the through electrode 21 may be, for example, approximately 200 to 400 μm. For example, copper (Cu) or a copper alloy may be used as the material of the through electrode 21.

A wiring layer 22 is formed on the lower surface 20B of the core substrate 20. A wiring layer 23 is formed on the upper surface 20A of the core substrate 20. The through electrode 21 electrically connects the wiring layers 22 and 23 to each other. The thickness of each wiring layer 22 and 23 may be, for example, approximately 15 to 35 μm. In each of the wiring layers 22 and 23, the wire width/wire interval (line L/space S) may be, for example, approximately 20 μm/20 μm. For example, copper or a copper alloy may be used as the material of the wiring layers 22 and 23.

The insulation layer 31 and the wiring layer 32 are sequentially stacked on the lower surface 20B of the core substrate 20. The insulation layer 31 is stacked on the lower surface 20B of the core substrate 20 so that the wiring layer 22 is covered. The thickness of the insulation layer 31 is, for example, smaller than that of the core substrate 20. For example, the thickness of the insulation layer 31 may be approximately 40 to 75 μm. The insulation layer 31, which includes the glass cloth 31G serving as the reinforcement material, has high mechanical strength (rigidity and hardness). The glass cloth 31G is arranged in the middle of the insulation layer 31 in the thicknesswise direction.

A through hole 31X, which extends through the insulation layer 31 in the thicknesswise direction, is formed in a predetermined location of the insulation layer 31. The through hole 31X splits the glass cloth 31G. A via wire 33, which electrically connects the wiring layers 22 and 32, is formed in the through hole 31X. That is, the through hole 31X is filled with the via wire 33. The through hole 31X and the via wire 33 are tapered such that the diameter reduces from the lower side (wiring layer 32) toward the upper side (core substrate 20) in FIG. 1A. For example, the through hole 31X has a truncated circular cone shape such that the upper open end has an opening diameter smaller than an opening diameter of the lower open end. In the same manner, the via wire 33 has a truncated circular cone shape such that the upper surface has a diameter smaller than a diameter of the lower surface. The opening diameter of the lower open end of the through hole 31X and the diameter of the lower surface of the via wire 33 are smaller than the diameter of the through electrode 21. For example, the opening diameter of the lower open end of the through hole 31X may be approximately 50 to 70 μm, and the diameter of the lower surface of the via wire 33 may be approximately 50 to 70 μm.

The wiring layer 32 is stacked on the lower surface of the insulation layer 31. The via wire 33 electrically connects the wiring layer 32 to the wiring layer 22. For example, the thickness of the wiring layer 32 may be approximately 15 to 35 μm. For example, the L/S of the wiring layer 32 may be approximately 20 μm/20 μm. For example, copper or a copper alloy may be used as the material of the wiring layer 32.

The insulation layer 41 and a via wire 42 (wiring layer), which is arranged in the insulation layer 41, are stacked on the upper surface 20A of the core substrate 20.

The insulation layer 41 is stacked on the upper surface 20A of the core substrate 20 so that the wiring layer 23 is covered. For example, the insulation layer 41 has a thickness smaller than the core substrate 20 and the insulation layer 31. For example, the thickness of the insulation layer 41 may be approximately 30 to 70 μm. The insulation layer 41, which includes the glass cloth 41G serving as the reinforcement material, has high mechanical strength (rigidity and hardness).

As illustrated in FIG. 1B, the insulation layer 41 includes a resin layer 43 and the glass cloth 41G. The glass cloth 41G is located closer to an upper side than the central position of the insulation layer 41 in the thicknesswise direction. The resin layer 43 includes an upper surface 43A. The glass cloth 41G includes a surface 41R, which is partially exposed on the upper surface 43A of the resin layer 43. A surface 41R of the glass cloth 41G that is exposed on the upper surface 43A of the resin layer 43 has a greater surface roughness than the upper surface 43A of the resin layer 43. The glass cloth 41G, which is partially exposed on the upper surface 43A of the resin layer 43, for example, projects from the upper surface 43A of the resin layer 43. Thus, the upper surface 41A of the insulation layer 41 includes a first irregularity portion, which is formed by the upper surface 43A of the resin layer 43 and the glass cloth 41G partially projected from the upper surface 43A of the resin layer 43, and a second irregularity portion formed in the surface 41R of the glass cloth 41G. The first irregularity portion has an irregularity pitch corresponding to an interval of the glass cloth 41G projected from the upper surface 43A of the resin layer 43. The second irregularity portion has an irregularity pitch corresponding to the surface roughness of the glass cloth 41G. In this manner, the upper surface 41A of the insulation layer 41 includes two structures having different irregularities.

A through hole 41X is formed in a predetermined location of the upper surface 41A of the insulation layer 41. The through hole 41X extends through the insulation layer 41 in the thicknesswise direction and exposes a portion of the upper surface of the wiring layer 23. The through hole 41X is tapered such that the diameter reduces from the upper side (wiring structure 12) toward the lower side (core substrate 20) in FIG. 1B. For example, the through hole 41X has an inverted truncated circular cone shape such that the lower open end has an opening diameter smaller than an opening diameter of the upper open end. The opening diameter of the upper open end of the through hole 41X is smaller than the diameter of the through electrode 21. For example, the opening diameter of the upper open end of the through hole 41X may be approximately 50 to 70 μm.

The through hole 41X splits the glass cloth 41G. An end portion A1 of the split glass cloth 41G projects from a side wall of the through hole 41X toward an inner side of the through hole 41X.

The via wire 42, which is electrically connected to the wiring layer 23, is formed in the through hole 41X. The via wire 42 extends through the insulation layer 41 in the thicknesswise direction. That is, the through hole 41X is filled with the via wire 42. In the same manner as the through hole 41X, the via wire 42 is tapered such that the diameter reduces from the upper side (wiring structure 12 of FIG. 1A) toward the lower side (wiring layer 23) in FIG. 1B. For example, the via wire 42 has an inverted truncated circular cone shape such that an upper end surface 42A has a diameter greater than a diameter of an lower end surface. The upper end surface 42A of the via wire 42 is exposed on the upper surface 41A of the insulation layer 41. For example, the upper end surface 42A of the via wire 42 is substantially flush with the upper surface 41A of the insulation layer 41 (the upper surface 43A of the resin layer 43). Alternatively, to improve the adhesion between the via wire 42 and an insulation layer 51, which will be described later, for example, the upper end surface 42A of the via wire 42 may project from the upper surface 41A of the insulation layer 41 (the upper surface 43A of the resin layer 43). For example, the diameter of the upper end surface 42A of the via wire 42 may be approximately 50 to 70 μm. For example, copper or a copper alloy may be used as the material of the via wire 42.

The via wire 42 entirely covers the end portion A1 of the glass cloth 41G, which projects from the side wall of the through hole 41X toward the inner side of the through hole 41X The structure of the wiring structure 12 will now be described.

As illustrated in FIG. 1A, the wiring structure 12 is stacked on an upper surface of the uppermost insulation layer 41 of the wiring structure 11. The wiring structure 12 is a high-density wiring layer, which includes a wiring layer of a higher density than the wiring structure 11.

The wiring structure 12 has a structure in which an insulation layer 51, a wiring layer 52, an insulation layer 53, a wiring layer 54, an insulation layer 55, and a wiring layer 56 are sequentially stacked on the insulation layer 41. The thickness T1 of the wiring structure 12 is indicated by the total thickness of the insulation layers 51, 53 and 55, which corresponds to the thickness from the upper surface 41A of the insulation layer 41 to an upper surface of the insulation layer 53. The thickness T1 may be, for example, approximately 10 to 40 μm.

For example, copper or a copper alloy may be used as the material of the wiring layers 52, 54 and 56. For example, a photosensitive insulative resin, the main component of which is a phenol resin or a polyimide resin, may be used as the material of the insulation layers 51, 53, and 55. The insulation layers 51, 53, and 55 may include a filler, such as silica or alumina.

The insulation layers 51, 53, and 55 are thinner than the wiring structure 11. For example, the thickness of the insulation layers 51, 53, and 55 may each be approximately 3 to 10 μm. The wiring layers 52, 54, and 56 are thinner than the wiring structure 11. For example, the thickness of the wiring layers 52 and 54 may each be approximately 1 to 3 μm. For example, the thickness of the wiring layer 56 may be approximately 10 to 15 μm. For example, the L/S of the wiring layers 52 and 54 may be approximately 2 μm/2 μm.

As illustrated in FIG. 1B, the insulation layer 51 covers the upper surface 41A of the insulation layer 41 and the upper end surface 42A of the via wire 42. That is, the insulation layer 51 entirely covers the surface of the glass cloth 41G, which projects from the upper surface 43A of the resin layer 43.

A through hole 51X is formed in a predetermined location of an upper surface 51A of the insulation layer 51. The through hole 51X extends through the insulation layer 51 in the thicknesswise direction and exposes a portion of the upper end surface 42A of the via wire 42. The through hole 51X is tapered such that the diameter reduces from the upper side (wiring layer 52) toward the lower side (wiring layer 23) in FIG. 1B. For example, the through hole 51X has an inverted truncated circular cone shape such that the upper open end has an opening diameter greater than an opening diameter of the lower open end.

The opening diameter of the upper open end of the through hole 51X is smaller than the opening diameter of the upper open end of the through hole 41X. Also, the opening diameter of the upper open end of the through hole 51X is smaller than the opening diameter of the lower open end of the through hole 41X. For example, preferably, the opening diameter of the upper open end of the through hole 51X is approximately 0.1 to 0.5 times greater than the opening diameter of the lower open end of the through hole 41X. For example, the opening diameter of the upper open end of the through hole 51X may be approximately 10 to 20 μm.

The through hole 51X is shallower than the through hole 41X. For example, the through hole 51X may have a depth of approximately 3 to 10 μm.

A via wire 57 is formed in the through hole 51X, which electrically connects the via wire 42 and the wiring layer 52. The via wire 57 is formed in the lowermost insulation layer 51 of the wiring structure 12. The via wire 57 extends through the insulation layer 51 in the thicknesswise direction. That is, the through hole 51X is filled with the via wire 57. In the same manner as the through hole 51X, the via wire 57 is tapered such that the diameter reduces from the upper side (wiring layer 52) toward the lower side (via wire 42) in FIG. 1B. For example, the via wire 57 has an inverted truncated circular cone shape such that the upper surface has a diameter greater than a diameter of the lower surface. For example, the upper surface of the via wire 57 may have a diameter of approximately 10 to 20 μm.

The through hole 51X and the via wire 57 are located immediately above the through hole 41X and the via wire 42. In the present example, the via wire 57 is located on the upper end surface 42A of the via wire 42. Preferably, the via wire 57 (through hole 51X) and the via wire 42 (through hole 41X) are stacked in a straight line in the stacking direction (vertical direction, direction Z in FIG. 1B) of the wiring substrate 10 to be connected to each other. In other words, the via wire 57 (through hole 51X) and the via wire 42 (through hole 41X) form vias (through holes) having a stacked via structure. In this manner, the via wire 57, which has a smaller diameter than the via 42, is stacked immediately above the via wire 42.

Preferably, the upper surface of the via wire 57 is entirely overlapped with the upper surface of the via wire 42 as viewed from above. Also, preferably, the via wire 57 is stacked on the via wire 42 such that the boundary surface of the via wire 57 and the insulation layer 51 does not coincide with the boundary surface of the via wire 42 and the insulation layer 41 as viewed from above.

The via wire 57 includes a bottom portion (lower end surface), which is located on and connected to the upper end surface 42A of the via wire 42. In the present example, the lower end surface of the via wire 57 entirely contacts the upper end surface 42A of the via wire 42. This electrically connects the via wires 57 and 42. In other words, although the via wires 57 and 42 are electrically connected, the via wires 57 and 42 are not integrally formed. For example, the via wire 57 includes a seed layer 57A arranged on the upper end surface 42A of the via wire 42 (i.e., a layer of Cu) and a metal layer 57B arranged on the seed layer 57A. The seed layer 57A is, for example, a stacked unit of layers of titanium (Ti) and Cu. The metal layer 57B is, for example, a layer of Cu. This electrically connects the metal layer 57B to the via wire 42 by the seed layer 57A.

The seed layer 57A entirely covers the internal surface of the through hole 51X and covers the bottom portion of the through hole 51X, that is, the upper end surface 42A of the via wire 42 exposed in the through hole 51X. Further, the seed layer 57A covers a portion of the upper surface 51A of the insulation layer 51. That is, the seed layer 57A extends from the internal surface of the through hole 51X to the upper surface 51A of the insulation layer 51. A metal film formed by sputtering (sputter film) may be used as the seed layer 57A. The seed layer 57A obtained by sputtering may be a metal film having a two-layer structure in which, for example, a layer of Ti formed by titanium (Ti) and a layer of Cu formed by copper (Cu) are sequentially stacked. In this case, the thickness of the layer of Ti may be, for example, approximately 20 to 50 nm, and the thickness of the layer of Cu may be, for example, approximately 100 to 300 nm. The layer of Ti functions as a metal barrier film, which impedes the diffusion of copper from the layer of Cu and the metal layer 57B (i.e., layer of Cu) to the insulation layer 51. As the material of the metal film functioning as a metal barrier film, titanium nitride (TiN), tantalum nitride (TaN), tantalum (Ta), or chromium (Cr) may be used other than Ti.

The metal layer 57B is formed in the through hole 51X on the seed layer 57A to entirely cover the surface of the seed layer 57A. That is, the through hole 51X is filled with the metal layer 57B and the seed layer 57A. An electrolytic plating metal layer may be used as the metal layer 57B. For example, copper or a copper alloy may be used as the material of the metal layer 57B.

The wiring layer 52 is connected to the upper surface of the via wire 57 and stacked on the upper surface 51A of the insulation layer 51. The wiring layer 52 is integrally formed with the via wire 57. The wiring layer 52 includes the seed layer 57A extending on the upper surface 51A of the insulation layer 51 and a metal layer 52B covering the upper surfaces of the seed layer 57A and the metal layer 57B. The metal layer 52B is integrally formed with the metal layer 57B. An electrolytic plating metal layer may be used as the metal layer 52B. For example, copper or a copper alloy may be used as the material of the metal layer 52B.

As illustrated in FIG. 1A, the insulation layer 53 is stacked on the upper surface 51A of the insulation layer 51 to cover the wiring layer 52. A through hole 53X is formed in a predetermined location of the insulation layer 53. The through hole 53X extends through the insulation layer 53 in the thicknesswise direction and exposes a portion of the upper surface of the wiring layer 52. The via wire 58 is formed in the through hole 53X to electrically connect the wiring layers 52 and 54. That is, the through hole 53X is filled with the via wire 58.

The wiring layer 54 is stacked on the upper surface of the insulation layer 53. The wiring layer 54 is electrically connected to the wiring layer 52 by the via wire 58. The wiring layer 54 is integrally formed with the via wire 58.

The insulation layer 55 is stacked on the upper surface of the insulation layer 53 to cover the wiring layer 54. A through hole 55X is formed in a predetermined location of the insulation layer 55. The through hole 55X extends through the insulation layer 55 in the thicknesswise direction and exposes a portion of the upper surface of the wiring layer 54. The via wire 59 is formed in the through hole 55X to electrically connect the wiring layers 54 and 56. The through hole 55X is filled with the via wire 59.

The through holes 53X and 55X and the via wires 58 and 59 are each tapered such that the diameter reduces from the upper side (wiring layer 56) toward the lower side (wiring structure 11) in FIG. 1A. For example, each of the through holes 53X and 55X has an inverted truncated circular cone shape such that the upper open end has an opening diameter greater than an opening diameter of the lower open end. In the same manner, each of the via wires 58 and 59 has an inverted truncated circular cone shape such that the upper surface has a diameter greater than a diameter of the lower surface. For example, the upper open ends of the through holes 53X and 55X may each have an opening diameter of approximately 10 to 20 μm. For example, the upper surfaces of the via wires 58 and 59 may each have a diameter of approximately 10 to 20 μm.

The wiring layer 56 is stacked on the upper surface of the insulation layer 55. The wiring layer 56 is the uppermost wiring layer located as the uppermost layer of the wiring structure 12. The wiring layer 56 is electrically connected to the wiring layer 54 by the via wire 59. The wiring layer 56 is integrally formed with the via wire 59.

The wiring layer 56 may have any shape or size as viewed from above. For example, the wiring layer 56 may be circular with a diameter of approximately 20 to 30 μm as viewed from above. For example, the wiring layer 56 may have a pitch of approximately 40 to 50 μm. For example, the wiring layer 56 functions as a mount pad of an electronic component to electrically connect an electronic component such as a semiconductor chip.

If necessary, a surface-processed layer may be formed on the surface (upper and side surfaces, or only upper surface) of the wiring layer 56 (pad). Examples of a surface-processed layer are a layer of gold (Au), a layer of nickel (Ni)/Au (a metal layer in which an Ni layer and an Au layer are sequentially stacked), and a layer of Ni/palladium (Pd)/Au (a metal layer in which an Ni layer, a Pd layer, and an Au layer are sequentially stacked). For example, an electroless plating metal layer may be used as the layer of Ni, the layer of Au, or the layer of Pd. The layer of Ni is a metal layer formed from Ni or an Ni alloy. The layer of Au is a metal layer formed from Au or an Au alloy. The layer of Pd is a metal layer formed from Pd or a Pd alloy. The surface-processed layer may be formed by performing an anti-oxidation process, such as an organic solderability preservative (OSP) process.

The solder resist layer 13 is formed on the lower surface of the wiring structure 11. The solder resist layer 13 is the outermost insulation layer (here, lowermost) arranged in the wiring substrate 10. The solder resist layer 13 is stacked on the lower surface of the lowermost insulation layer 31 of the wiring structure 11 and covers the lowermost wiring layer 32 of the wiring structure 11.

The solder resist layer 13 includes an opening 13X, which exposes a portion of the lowermost wiring layer 32 as an external connection pad P1. The external connection pad P1 is capable of connecting to an external connection terminal 76 (refer to FIG. 3), such as solder ball or a lead pin, which is used when the wiring substrate 10 is mounted on a mount substrate such as a motherboard.

If necessary, the wiring layer 32 (external connection pad P1), which is exposed in the opening 13X, may include a surface-processed layer. Examples of the surface-processed layer are a layer of Au, a layer of Ni/Au (a metal layer in which an Ni layer and an Au layer are sequentially stacked), and a layer of Ni/Pd/Au (a metal layer in which an Ni layer, a Pd layer, and an Au layer are sequentially stacked). For example, an electroless plating metal layer may be used as the Ni layer, the Au layer, or the Pd layer. A surface-processed layer may be formed by performing an anti-oxidation process, such as the OSP process. The wiring layer 32, which is exposed in the opening 13X, may be used as an external connection terminal. The surface-processed layer formed on the wiring layer 32 may be used as an external connection terminal.

The opening 13X and the external connection pad P1 may each have any shape or size as viewed from above. For example, the opening 13X and the external connection pad P1 may each be circular with a diameter of approximately 200 to 300 μm as viewed from above. For example, a photosensitive insulative resin, the main component of which is a phenol resin or a polyimide resin, may be used as the material of the solder resist layer 13. The solder resist layer 13 may include a filler, such as silica or alumina.

The thickness T2 of the solder resist layer 13, that is, the thickness T2 from the lower surface of the insulation layer 31 to the lower surface of the solder resist layer 13, is greater than or equal to the thickness T1 of the wiring structure 12. For example, when the thickness T1 of the wiring structure 12 is 30 μm, the thickness T2 of the solder resist layer 13 may be approximately 30 to 50 μm. Preferably, the ratio of the thickness T1 of the wiring structure 12 to the thickness T2 of the solder resist layer 13, that is, T1/T2 is less than or equal to one. More preferably, T1/T2 is less than or equal to 0.75. The thickness of the solder resist layer 13 set in this manner reduces the warpage amount of the wiring substrate 10.

In the wiring substrate 10, preferably, the elastic modulus of the core substrate 20 is approximately 30 GPa. Preferably, the coefficient of thermal expansion of the core substrate 20 is approximately 10 ppm/° C. Preferably, the elastic modulus of the insulation layers 31 and 41, each of which contains a thermosetting resin as the main component and includes a reinforcement material, is approximately 15 to 30 GPa. Preferably, the coefficient of thermal expansion of the insulation layers 31 and 41 is approximately 10 to 20 ppm/° C. Preferably, the elastic modulus of the insulation layers 51, 53, and 55, the main component of which is a photosensitive resin, is approximately 5 GPa. Preferably, the coefficient of thermal expansion of the insulation layers 51, 53, and 55 is approximately 50 to 70 ppm/° C. Preferably, the elastic modulus of the solder resist layer 13, the main component of which is a photosensitive resin, is approximately 2 to 4 GPa. Preferably, the coefficient of thermal expansion of the solder resist layer 13 is approximately 40 to 50 ppm/° C.

The coefficient of thermal expansion of each insulation layer may be adjusted to a desirable value, for example, in correspondence with the contained amount of a filler. However, in the insulation layer, the main component of which is a photosensitive resin, exposure cannot be accomplished when the contained amount of the filler is increased. This limits the (maximum) amount of the filler that can be contained. Thus, there is a tendency in which the coefficient of thermal expansion of the insulation layer, the main component of which is a photosensitive resin, is greater than that of the insulation layer, the main component of which is a thermosetting resin. Other than silica or alumina as described above, for example, kaolin ($Al_2Si_2O_5$ ($OH_4$)) or talc ($Mg_3Si_4O_{10}$ ($OH_2$)) may be used as a filler. Alternatively, kaolin and talc may be used together.

By setting the above physical properties (elastic modulus and coefficient of thermal expansion), the wiring substrate 10 gradually softens from the core substrate 20 toward the outer layers. This limits the warpage of the wiring substrate 10 together with the synergy effect of the above relationship of the thickness T2 of the solder resist layer 13 and the thickness T1 of the wiring structure 12.

The structure of a semiconductor package 60 will now be described with reference to FIG. 3.

The semiconductor package 60 includes the wiring substrate 10, one or more semiconductor chips 70, and an underfill resin 75.

The semiconductor chip 70 is flip-chip-mounted on the wiring substrate 10. More specifically, a joint member 72 joins the wiring layer 56 (pad) of the wiring substrate 10 with a connection terminal 71 arranged on a surface of the semiconductor chip 70 where a circuit is formed (here, lower surface). This electrically connects the semiconductor chip 70 to the wiring layer 56 through the connection terminal 71 and the joint member 72.

A logic chip, such as a central processing unit (CPU) or a graphics processing unit (GPU), may be used as the semiconductor chip 70. Also, a memory chip, such as a dynamic random access memory (DRAM) chip, a static random access memory (SRAM) chip, or a flash memory chip, may be used as the semiconductor chip 70. When a plurality of the semiconductor chips 70 are mounted on the wiring substrate 10, a logic chip and a memory chip may be mounted on the wiring substrate 10 together. For example, a CPU chip and a DRAM chip may be mounted on the wiring substrate 10, and a GPU chip and a DRAM chip may be mounted on the wiring substrate 10.

For example, the size of the semiconductor chip 70 may be approximately 3 mm×3 mm to 12 mm×12 mm as viewed from above. For example, the thickness of the semiconductor chip 70 may be approximately 50 to 100 µm.

For example, a metal post may be used as the connection terminal 71. The connection terminal 71 is rod-shaped extending downward from the circuit formation surface of the semiconductor chip 70. In the present example, the connection terminal 71 is columnar, for example. For example, the height of the connection terminal 71 may be approximately 10 to 20 µm. For example, the diameter of the connection terminal 71 may be approximately 20 to 30 µm. For example, the pitch of the connection terminal 71 may be approximately 40 to 50 µm. For example, copper or a copper alloy may be used as the material of the connection terminal 71. Other than a metal post, for example, a gold bump or a solder bump may be used as the connection terminal 71.

The joint member 72 is joined with the wiring layer 56 (pad) and the connection terminal 71. For example, a layer of tin (Sn) or a lead (Pb)-free solder plating may be used as the joint member 72. For example, a lead-free solder, such as an Sn-silver (Ag) type, an Sn—Cu type, or an Sn—Ag—Cu type, may be used as the material of the solder plating. For example, the thickness of the joint member 72 may be approximately 5 to 15 µm.

A gap between the wiring substrate 10 and the semiconductor chip 70 is filled with the underfill resin 75. For example, an insulative resin, such as an epoxy resin, may be used as the material of the underfill resin 75.

The external connection terminal 76 is formed on the external connection pad P2 of the wiring substrate 10. The external connection terminal 76 is used to electrically connect to a pad arranged on a mount substrate, such as a motherboard (not illustrated). For example, a solder ball or a lead pin may be used as the external connection terminal 76. In the present example, a solder ball is used as the external connection terminal 76.

The operation of the wiring substrate 10 and the semiconductor package 60 will now be described.

The insulation layers 31 and 41 formed from the insulative resin containing the reinforcement material are respectively formed on the lower surface 20B and the upper surface 20A of the core substrate 20. Consequently, even when the mechanical strength of the core substrate 20 decreases resulting from the reduced thickness of the core substrate 20, the mechanical strength of the insulation layers 31 and 41 may compensate for the decreased mechanical strength. This case will be described below.

The through electrode 21 formed in the core substrate 20 has a diameter of approximately 100 to 200 µm. The via wires 33 and 42 formed in the insulation layers 31 and 41 containing the reinforcement material has a diameter of approximately 50 to 70 µm. That is, the diameter of the via wires 33 and 42 is set to be smaller than that of the through electrode 21. Therefore, for example, when a number of the through electrodes 21 corresponding to the number of the via wires 33 (or, the via wires 42) are arranged, the amount of the glass cloth 31G of the insulation layer 31 (or, the glass cloth 41G of the insulation layer 41) that is split by the via wires 33 (or, the via wires 42) is less than the amount of the glass cloth 20G of the core substrate 20 that is split by the through electrodes 21. This ensures the sufficient strength (rigidity) of the wiring substrate 10 even when the insulation layers 31 and 41 containing the reinforcement material are relatively thin.

The mechanical strengths of a first structure (wiring structure 11) and a second structure (wiring structure in the prior art), which have the same thickness, are compared. In the first structure, the insulation layers 31 and 41 are formed on the lower surface 20B and the upper surface 20A of the core substrate 20. In the second structure, the insulation layers 31 and 41 are not formed on the lower surface 20B and the upper surface 20A of the core substrate 20. For example, the first structure has an overall thickness of 500 µm, where the core substrate 20 has a thickness of 375 µm, the insulation layer 31 has a thickness of 75 µm, and the insulation layer 41 has a thickness of 50 µm. The second structure has an overall thickness of 500 µm, where the core substrate 20 has a thickness of 500 µm. In this case, the first structure, which includes the insulation layers 31 and 41, includes a larger amount of a glass cloth than the second structure, which only includes the core substrate 20. Thus, the first structure has a relatively small amount of the split glass cloth as compared to the second structure. This allows the first structure to have a higher mechanical strength than the second structure. Consequently, even when the thickness of the first structure is reduced more than the thickness of the second structure, the first structure may have the same mechanical strength as the second structure. By employing the first structure (wiring structure 11), which includes the insulation layers 31 and 41 formed on the lower surface 20B and the upper surface 20A of the core substrate, the wiring substrate 10 may have the sufficient rigidity while reducing the overall thickness of the first structure. More specifically, even when the thickness of the core substrate 20 is reduced and the insulation layers 31 and 41, which are thinner than the reduced thickness, are stacked on the lower surface 20B and the upper surface 20A of the core substrate 20, the rigidity of the wiring substrate 10 may be sufficiently ensured. This allows the overall thickness of the wiring substrate 10 to be reduced and limits the generation of warpage and undulation in the wiring substrate 10.

When warpage or undulation is generated in the wiring substrate 10, stress is applied to the boundary surface between the insulation layer 41, the main component of which is the thermosetting resin, and the insulation layer 51, the main component of which is the photosensitive resin. Under this condition, if the upper surface 41A of the insulation layer 41 is flat and smooth, the adhesion between the insulation layers 41 and 51 is weak. This easily separates the insulation layer 51 from the insulation layer 41 due to the stress. To cope with the problem, the present example employs the wiring structure 11 (first structure) in the wiring substrate 10. This limits the generation of warpage or undulation in the wiring substrate 10 and the delamination of the insulation layer 51 from the insulation layer 41.

Further, in the wiring structure 11 (wiring substrate 10), the glass cloth 41G is exposed on and projected from the upper surface 41A of the insulation layer 41. The exposed and projected glass cloth 41G increases the roughness of the upper surface 41A of the insulation layer 41. This improves the adhesion between the insulation layers 41 and 51. More specifically, a contacting area between the insulation layer 51 and the upper surface 41A of the insulation layer 41 is increased as compared to when the upper surface 41A of the insulation layer 41 is flat and smooth. This improves the adhesion between insulation layers 41 and 51 and limits the delamination of the insulation layer 51 from the insulation layer 41.

The method for manufacturing the wiring substrate 10 will now be described. Although a single wiring substrate 10 is enlarged in the description below, in the actual process, after manufacturing a batch of the wiring substrates 10 on one substrate, the substrate is fragmentized into individual wiring substrates 10.

Figure 4A:
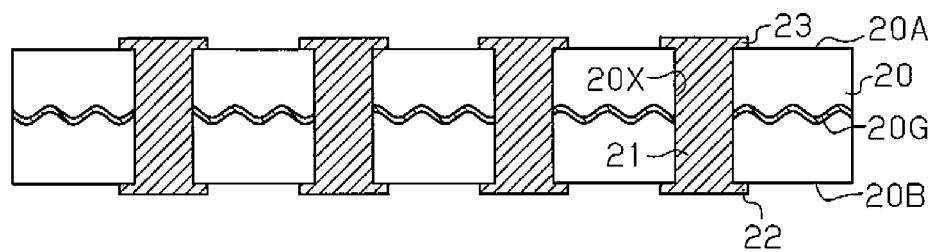
FIGS. 4A to 4C, 5A to 5C, 6A to 6D, 7A to 7C, 8A, 8B, 9A, 9B, and 10A are schematic cross-sectional views illustrating a method for manufacturing the wiring substrate of FIG. 1A, where

In the step illustrated in FIG. 4A, the through hole 20X is formed in, for example, a copper clad laminate (CCL) serving as the core substrate 20. Then, the through electrode 21 is formed in the through hole 20X by the electrolytic plating process or the paste filling process. The copper clad laminate may be formed, for example, by placing copper foils on both surfaces of a pre-preg and heating and pressurizing the pre-preg. The pre-preg is an adhesive sheet obtained by impregnating a thermosetting resin such as an epoxy resin in a glass cloth serving as the reinforcement material and processing the resin to the B-stage state (partially cured state).

Next, the wiring layer 23 is formed on the upper surface 20A of the core substrate 20, for example, by the subtractive process. Also, the wiring layer 22 is formed on the lower surface 20B of the core substrate 20.

Figure 4B:
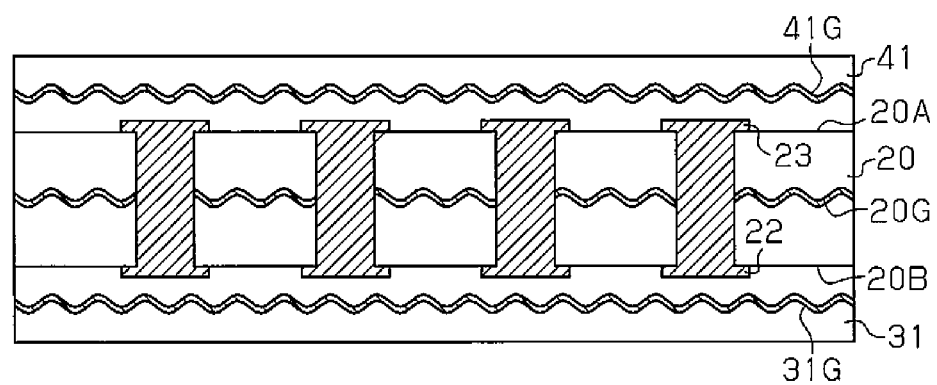
Figure 4C:
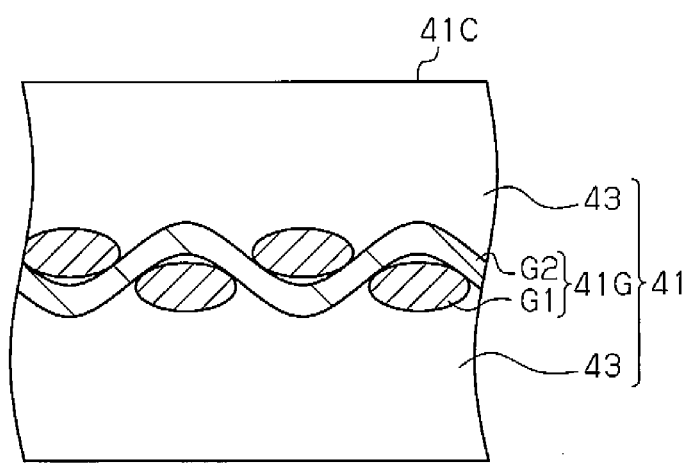

In the step illustrated in FIG. 4B, the insulation layer 31 is formed so that the lower surface 20B of the core substrate 20 and the wiring layer 23 are covered. Also, the insulation layer 41 is formed so that the upper surface 20A of the core substrate 20 and the wiring layer 23 are covered. The insulation layers 31 and 41 may be formed, for example, by, after stacking a resin film on the core substrate 20, heating the resin film to a temperature of approximately 130° C. to 200° C. while pressurizing the resin film to cure the resin film. The resin film is formed, for example, by impregnating a thermosetting resin such as an epoxy resin in a glass cloth serving as the reinforcement material. As illustrated in FIG. 4C, in the insulation layer 41, the upper and lower surfaces of the glass cloth 41G are covered with the resin layer 43. The glass cloth 41G is located in the middle of the insulation layer 41 in the thicknesswise direction. In the same manner, as illustrated in FIG. 4B, in the insulation layer 31, the upper and lower surfaces of the glass cloth 31G is covered with a resin layer (i.e., insulation layer 31). The glass cloth 31G is located in the middle of the insulation layer 31 in the thicknesswise direction. For example, the thickness of the insulation layer 41 is set to be the same as the thickness of the insulation layer 31.

Figure 5A:
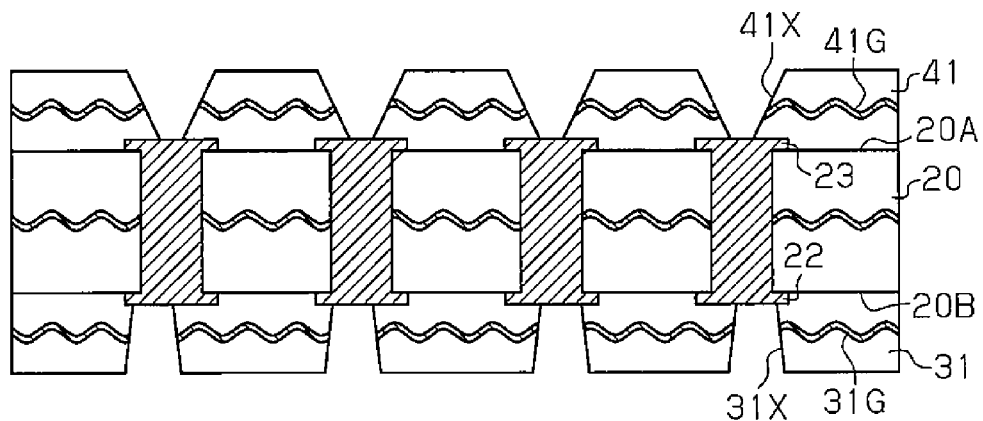
Figure 5B:
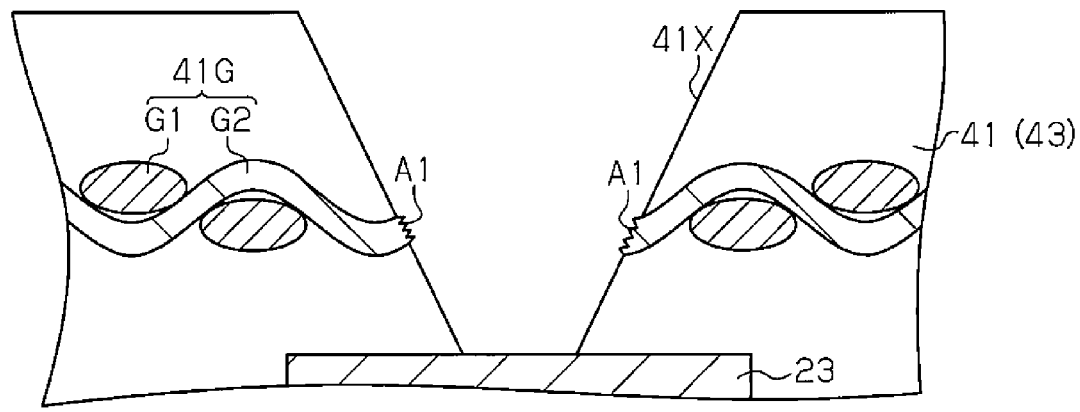

In the step illustrated in FIG. 5A, the through hole 31X is formed in a predetermined location of the insulation layer 31 so that a portion of the lower surface of the wiring layer 22 is exposed. Further, the through hole 41X is formed in a predetermined location of the insulation layer 41 so that a portion of the upper surface of the wiring layer 23 is exposed. The through holes 31X and 41X may be formed, for example, by a laser processing using such as a $CO_2$ laser or UV-YAG laser. As illustrated in FIG. 5B, when the through hole 41X is formed by the laser processing, the end portion A1 of the glass cloth 41G, which is cut by the laser, projects from the side wall of the through hole 41X toward the inner side of the through hole 41X. As a result, the end portion A1 of the glass cloth 41G has a greater surface roughness than that of the resin layer 43 forming the side wall of the through hole 41X. In the same manner, when the through hole 31X is formed by the laser processing, the end portion of the glass cloth 31G, which is cut by the laser, projects from the side wall of the through hole 31X toward the inner side of the through hole 31X.

Next, the desmear process is performed to remove resin smear from the surfaces of the wiring layers 22 and 23 exposed in the bottom portions of the through holes 31X and 41X.

Figure 5C:
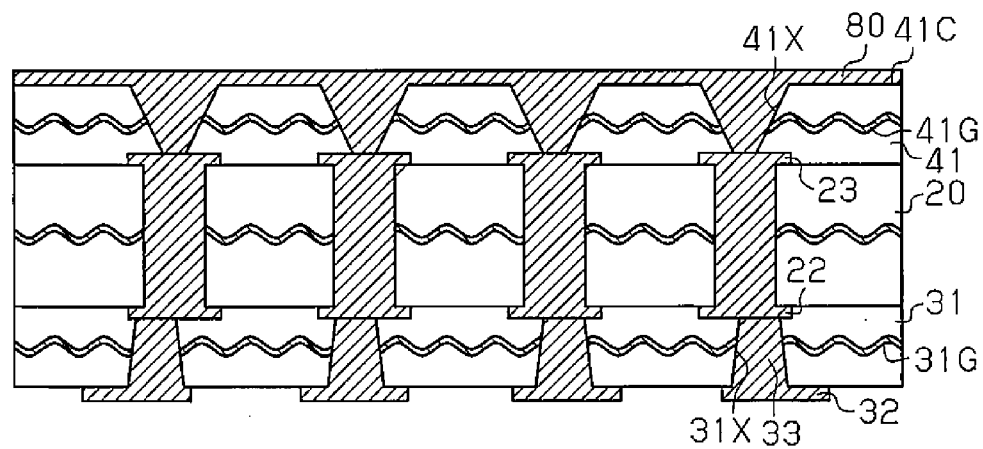

In the step in FIG. 5C, the via wire 33 is formed in the through hole 31X of the insulation layer 31. The wiring layer 32 is stacked on the insulation layer 31 so that the wiring layer 32 is electrically connected to the wiring layer 22 by the via wire 33. The via wire 33 and the wiring layer 32 may be formed, for example, using various wire formation processes, such as the semi-additive process and the subtractive process. By using such wire formation processes, the via wire 33 and the wiring layer 32 are formed from plating metal of, for example, copper or a copper alloy.

In the step illustrated in FIG. 5C, the seed layer (not illustrated) is formed to entirely cover the surface of the insulation layer 41 including the internal surface of the through hole 41X and the upper surface of the wiring layer 23 exposed in the through hole 41X. Then, the electrolytic plating (panel plating) is performed using the seed layer as a power supplying layer. For example, the seed layer is formed by the electroless copper plating process. Then, using the seed layer as the power supplying layer, the electrolytic plating process is performed. This forms a conductive layer 80, which fills the through hole 41X and entirely covers the upper surface 41C of the insulation layer 41.

Figure 6A:
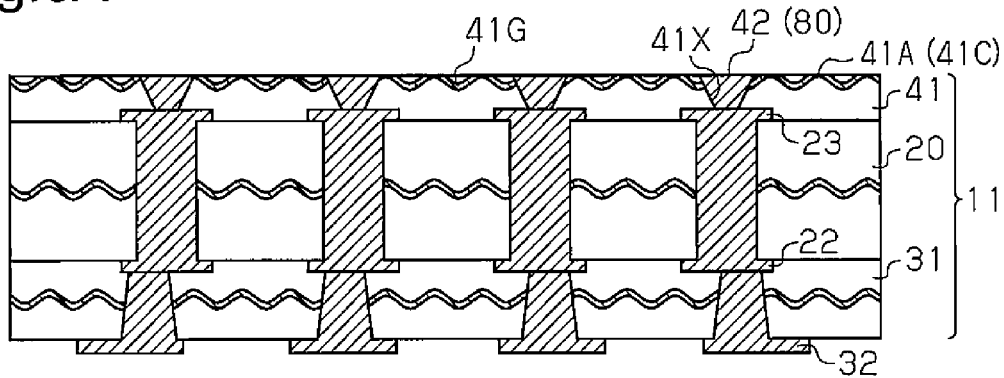

In the step illustrated in FIG. 6A, the upper surface of the conductive layer 80 and the upper surface 41C of the insulation layer 41 are polished, for example, by the chemical mechanical polishing (CMP) process. First, the conductive layer 80 is polished so that the upper surface 41C of the insulation layer 41 is exposed. Then, the upper surface 41C of the insulation layer 41 and the upper surface of the conductive layer 80 located in the through hole 41X are polished until a portion of the glass cloth 41G is exposed.

Figure 6B:
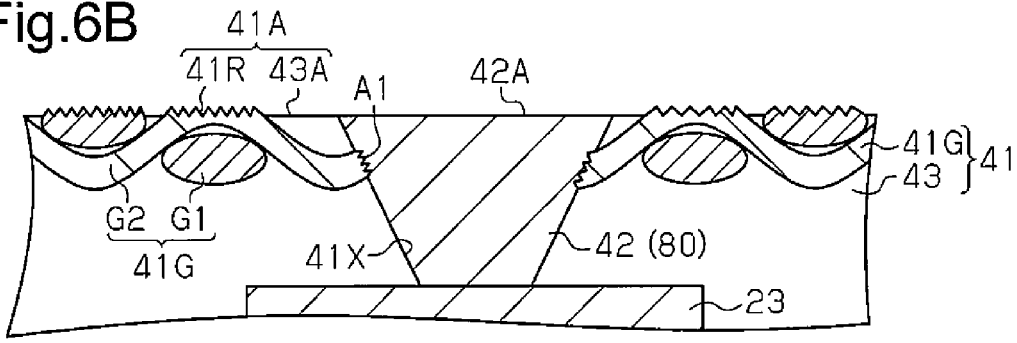

That is, as illustrated in FIG. 6B, the upper surface of the conductive layer 80 and the upper surface 41C of the insulation layer 41 are polished until a portion (surface 41R) of the glass cloth 41G is exposed on the upper surface 43A of the resin layer 43. Consequently, the upper surface 41A of the insulation layer 41 is formed by the upper surface 43A of the resin layer 43 and the portion (surface 41R) of the glass cloth 41G projected from the upper surface 43A of the resin layer 43. The surface R41 of the glass cloth 41G exposed on and projected from the upper surface 43A of the resin layer 43 has a greater surface roughness than upper surface 43A of the resin layer 43. Thus, the upper surface 41A of the insulation layer 41 includes the first irregularity portion, which is formed by the upper surface 43A of the resin layer 43 and the glass cloth 41G partially projected from the upper surface 43A of the resin layer 43, and the second irregularity portion, which is formed in the surface 41R of the glass cloth 41G.

In the CMP process of the present example, when polishing the conductive layer 80 formed on the upper surface 41C of the insulation layer 41, the material of a slurry, the hardness of the polishing pad, and the like are adjusted so that the polished amount of the conductive layer 80 (metal) is greater than that of the insulation layer 41 (resin). Additionally, after the upper surface 41C of the insulation layer 41 is exposed, the material of the slurry, the hardness of the polishing pad, and the like are changed. For example, after the upper surface 41C of the insulation layer 41 is exposed, the material of the slurry, the hardness of the polishing pad, and the like are adjusted so that the polished amount of the insulation layer 41 (resin) is greater than that of the conductive layer 80 (metal).

When the via wire 42 is formed in the through hole 41X, the upper end surface 42A of the via wire 42 is substantially flush with the upper surface 41A of the insulation layer 41 (the upper surface 43A of the resin layer 43). The via wire 42 entirely covers the end portion A1 of the glass cloth 41G projected from the side wall of the through hole 41X toward the inner side of the through hole 41X. In other words, the end portion A1 of the glass cloth 41G projects into the via wire 42.

The upper surface 41C of the insulation layer 41 may be polished so that the upper surface 41A of the insulation layer 41 is recessed from the upper end surface 42A of the via wire 42 toward the core substrate 20, for example, by adjusting the material of a slurry, the hardness of the polishing pad, and the like. This improves the adhesion between the insulation layer 41 and the insulation layer 51, which is formed in a subsequent step. Through the manufacturing procedures, the wiring structure 11 may be manufactured.

Figure 6C:
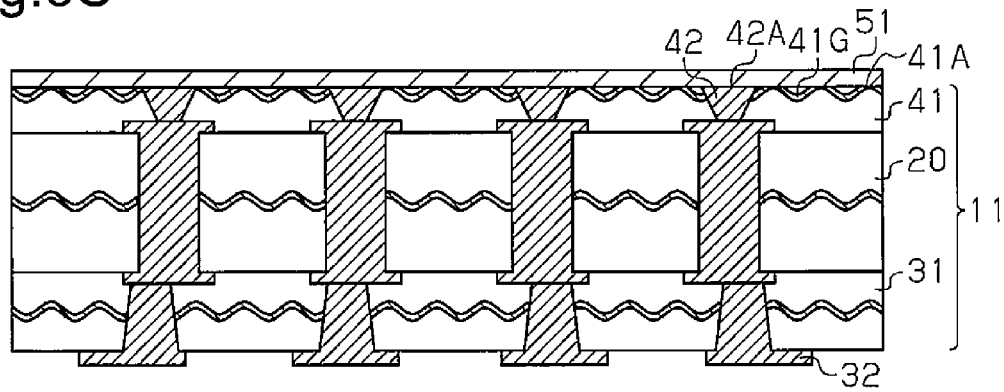
Figure 6D:
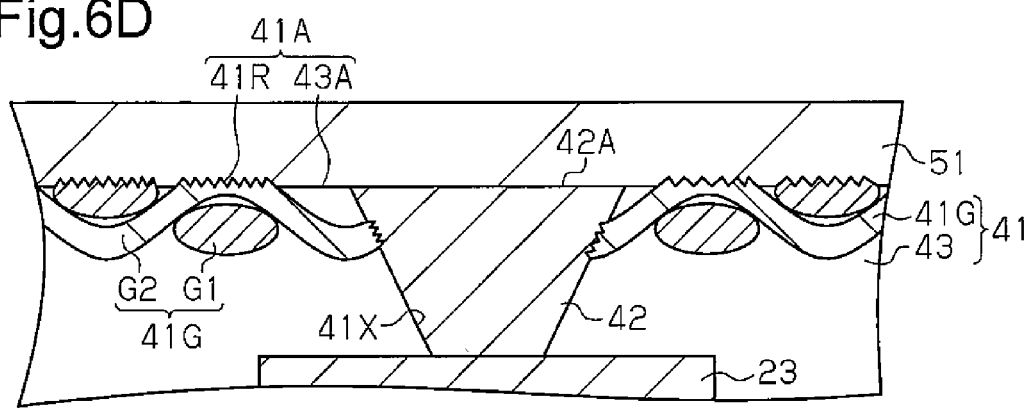

In the step illustrated in FIG. 6C, the insulation layer 51 is formed on the upper surface 41A of the insulation layer 41 so that the upper surface 41A and the upper end surface 42A of the via wire 42 are entirely covered. In this case, as illustrated in FIG. 6D, the insulation layer 51 entirely covers the upper surface 43A of the resin layer 43 and the surface 41R of the glass cloth 41G projected from the upper surface 43A. Thus, the glass cloth 41G projects from the upper surface 43A of the resin layer 43 toward the insulation layer 51. This improves the adhesion strength between the insulation layers 41 and 51 and limits the delamination of the insulation layer 51 from the insulation layer 41.

Figure 7A:
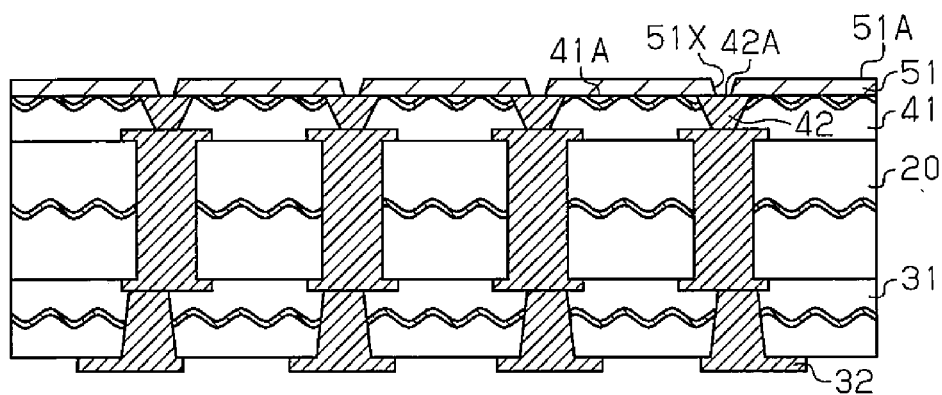

In the step illustrated in FIG. 7A, the through hole 51X may be formed in a predetermined location of the insulation layer 51, for example, by the photolithography process. The through hole 51X extends through the insulation layer 51 in the thicknesswise direction and exposes a portion of the upper end surface 42A of the via wire 42. The insulation layer 51 is formed from a photosensitive resin. The upper surface 51A of the insulation layer 51 has a lower surface roughness than the upper surface 41A of the insulation layer 41 formed by a thermosetting resin. For example, the upper surface 51A of the insulation layer 51 may have a surface roughness Ra value of approximately 2 to 10 nm.

Figure 7B:
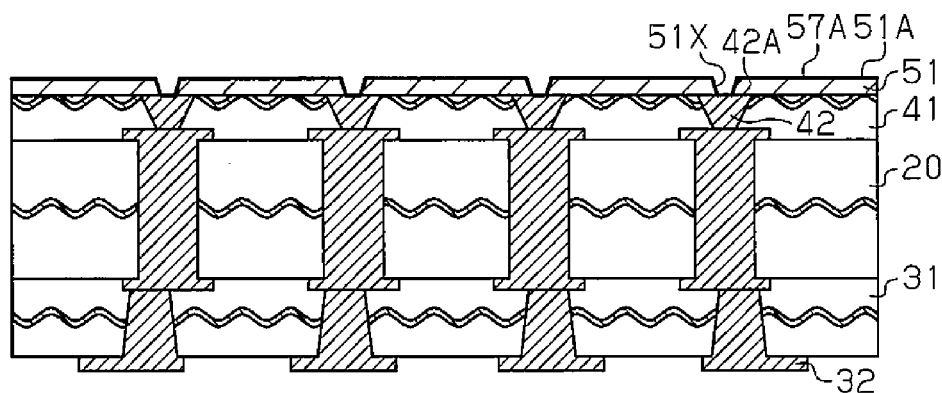

In the step illustrated in FIG. 7B, the seed layer 57A is formed so that the surface of the insulation layer 51 including the internal surface of the through hole 51X is entirely covered. The seed layer 57A may be formed, for example, by the sputtering process or the electroless plating process. The upper surface 51A of the insulation layer 51 is flat and smooth. Thus, the seed layer 57A may be evenly formed on the upper surface 51A of the insulation layer 51 by the sputtering process. Consequently, the seed layer 57A may have a flat and smooth upper surface. Also, in this case, the seed layer 57A is thinner than when forming the seed layer 57A on a rough surface by the sputtering process.

For example, when the seed layer 57A is formed by the sputtering process, a layer of titanium (Ti) is deposited on the upper end surface 42A of the via wire 42 and the entire surface of the insulation layer 51 including the internal surface of the through hole 51X by sputtering. Then, a layer of copper (Cu) is deposited on the layer of Ti by sputtering. This forms the seed layer 57A having a two-layer structure (layer of Ti/layer of Cu). The formation of the layer of Ti as a lower layer of the seed layer 57A improves the adhesion between the insulation layer 51 and the seed layer 57A. The layer of Ti may be changed to a layer of TiN formed from titanium nitride (TiN) so that the seed layer 57A is formed by a two-layer structure having the layer of TiN and the layer of Cu. Titanium and titanium nitride are metal having a higher corrosion resistance than copper. When the electroless plating process is used, for example, the seed layer 57A may be formed by the layer of Cu (one-layer structure) by performing the electroless copper plating.

Before forming the seed layer 57A, a plasma treatment such as an $O_2$ plasma asking may be performed on the surface of the insulation layer 51. The plasma treatment roughens the surface of the insulation layer 51. The rough surface of the insulation layer 51 improves the adhesion between the seed layer 57A and the insulation layer 51. Contrarily, fine wires may be formed on the surface of the insulation layer 51 when the surface roughness of the insulation layer 51 is decreased to improve the smoothness. Therefore, in the plasma treatment, the surface of the insulation layer 51 is roughened to a degree that does not affect the formation of fine wires in a subsequent step.

Figure 7C:
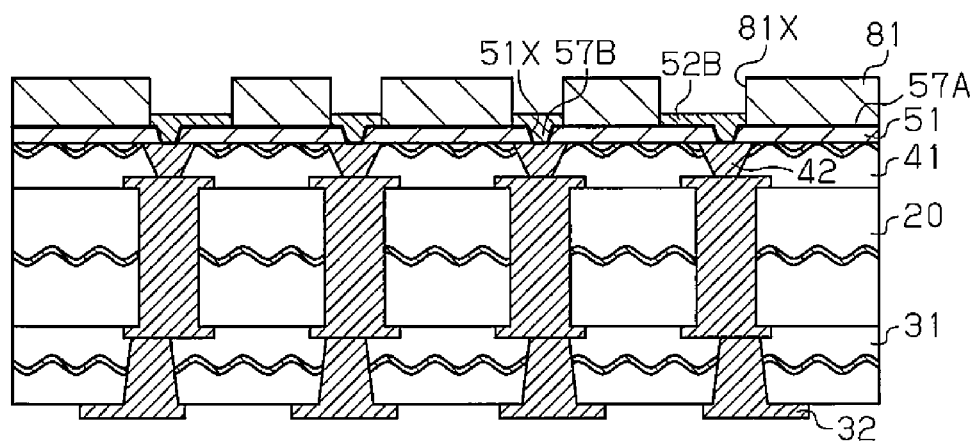

In the step illustrated in FIG. 7C, a resist layer 81, which includes an opening pattern 81X in a predetermined location, is formed on the seed layer 57A. The opening pattern 81X exposes the seed layer 57A on a location corresponding to the region where the wiring layer 52 is formed (refer to FIG. 1A). As the material of the resist layer 81, for example, a material having a plating resistance against the plating process performed in the next step may be used. For example, a photosensitive dry film resist or a liquid photoresist may be used as the material of the resist layer 81. As the material of such resists, for example, a novolak resin or acryl resin may be used. For example, when a photosensitive dry film resist is used, a dry film is stacked on the upper surface of the seed layer 57A and undergoes a thermal press fitting, and the dry film is patterned by a photolithography. This forms the resist layer 81 including the opening pattern 81X. When a liquid photoresist is used, the resist layer 81 may be formed through the same process. In this process, the upper surface of the seed layer 57A is flat and smooth. This limits the generation of a defective pattern in the resist layer 81 formed on the seed layer 57A. That is, the opening pattern 81X may be formed in the resist layer 81 in a highly accurate manner.

Subsequently, the electrolytic plating is performed by using the resist layer 81 as a plating mask and the seed layer 57A as the plating power supplying layer. More specifically, the electrolytic plating (here, electrolytic copper plating) is performed on the upper surface of the seed layer 57A exposed in the opening pattern 81X of the resist layer 81. This fills the through hole 51X at the inner side of the seed layer 57A with the metal layer 57B (here, electrolytic copper plating metal layer). Further, by continuing the electrolytic plating, the metal layer 52B (here, electrolytic copper plating metal layer) is formed on the upper surfaces of the metal layer 57B and the seed layer 57A.

Figure 8A:
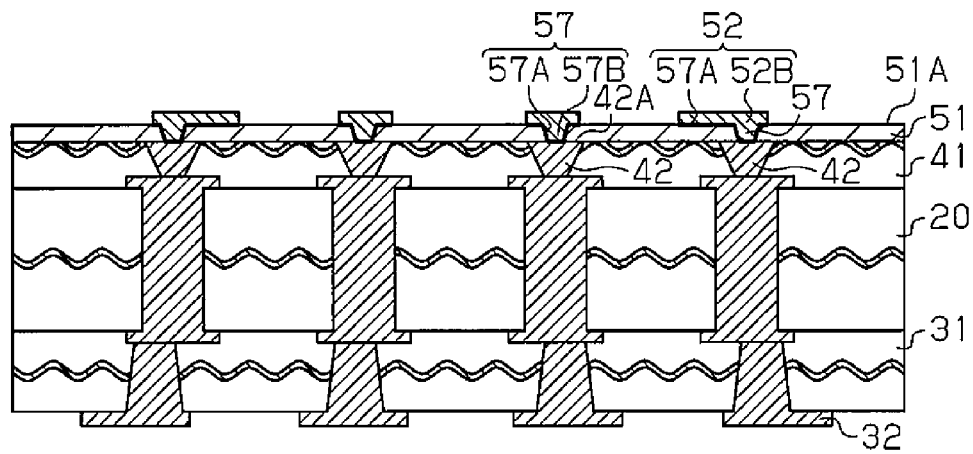
Figure 8B:
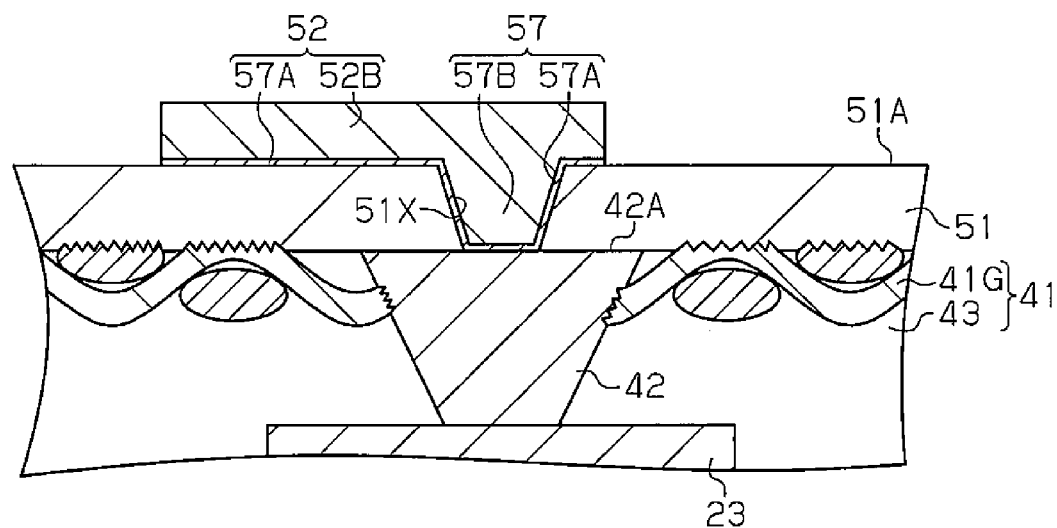
Figure 8B:
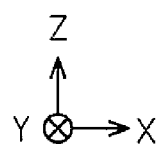

In the step illustrated in FIG. 8A, the resist layer 81 illustrated in FIG. 7C is removed, for example, using an alkaline dissociation solution. Then, an unnecessary portion of the seed layer 57A is removed by etching using the metal layers 52B and 57B as etching masks. This stacks the via wire 57 on the upper end surface 42A of the via wire 42 and forms the wiring layer 52, which is electrically connected to the via wire 42 by the via wire 57, on the insulation layer 51, as illustrated in FIG. 8B. The seed layer 57A covers the internal surface and the bottom portion of the through hole 51X. The bottom portion of the through hole 51X corresponds to the upper end surface 42A of the via wire 42 exposed in the through hole 51X. The metal layer 57B fills the through hole 51X at the inner side of the seed layer 57A. The wiring layer 52 is formed by the seed layer 57A and the metal layer 52B. The seed layer 57A is formed on the upper surface 51A of the insulation layer 51. The metal layer 52B is formed on the via wire 57. In this manner, the via wire 57 and the wiring layer 52 are integrally formed by the semi-additive process. The via wires 42 and 57 are formed in different processes. Thus, the via wires 42 and 57 are not integrally formed.

Further, in the present example, there is no wiring layer formed integrally with the via wire 42 on the upper surface 41A of the insulation layer 41. When a wiring layer covers the glass cloth 41G exposed on the upper surface 41A of the insulation layer 41, the wiring may short-circuit. To avoid such short-circuiting of the wiring, no wiring layer is formed on the upper surface 41A of the insulation layer 41. Instead, the via wire 57 is directly stacked on the upper end surface 42A of the via wire 42. As long as the wiring does not short-circuit, a wiring layer formed integrally with the via wire 42 may be stacked on the upper surface 41A of the insulation layer 41. Then, the via wire 57 may be formed on the wiring layer.

Figure 9A:
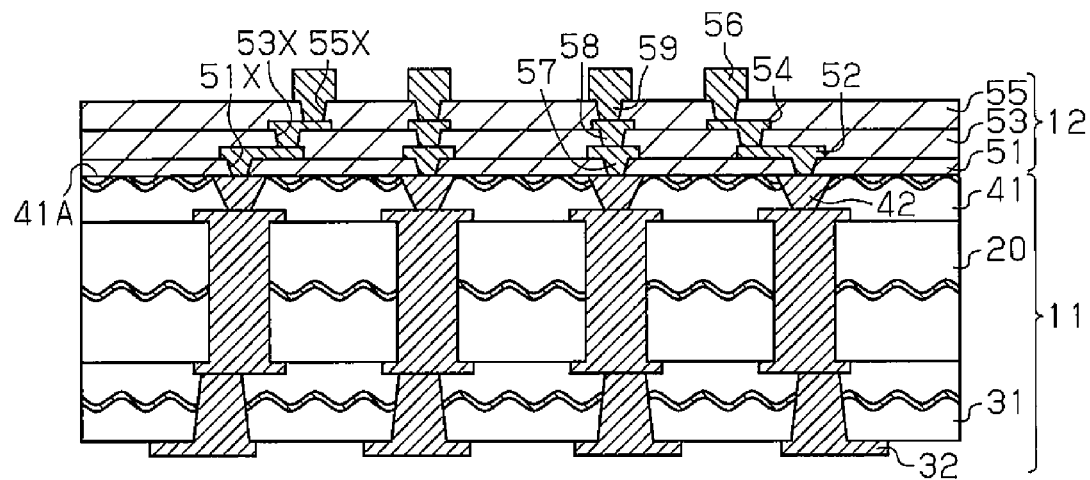
Figure 9B:
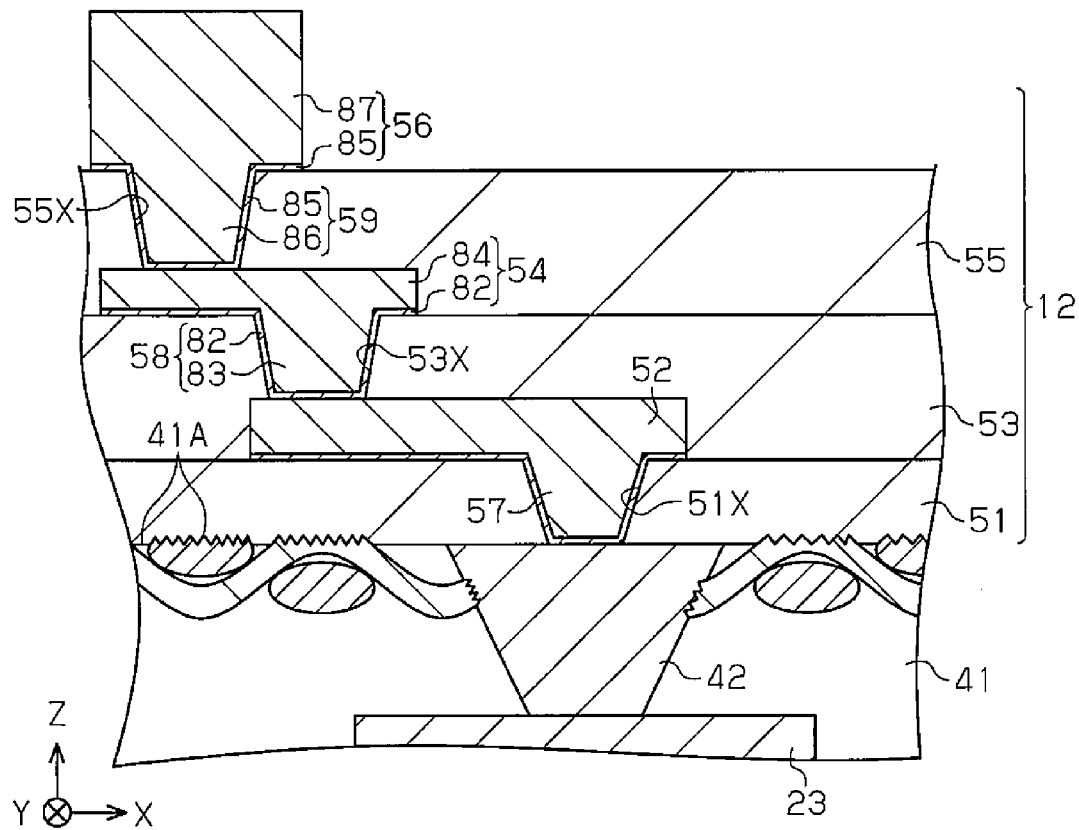

In the steps illustrated in FIGS. 9A and 9B, the insulation layer 53 is formed on the insulation layer 51 through the same steps as illustrated in FIGS. 6C and 7A. The insulation layer 53 includes the through hole 53X, which exposes a portion of the upper surface of the wiring layer 52. Then, through the same steps as illustrated in FIGS. 7B to 8B, the via wire 58 and the wiring layer 54 are formed, for example, using the semi-additive process. The through hole 53X is filled with the via wire 58. The wiring layer 54 is formed on the insulation layer 53 and electrically connected to the wiring layer 52 by the via wire 58. As illustrated in FIG. 9B, in the same manner as the via wire 57, the via wire 58 is formed by a seed layer 82 and an electrolytic copper plating layer 83. The seed layer 82 is formed in the through hole 53X. The through hole 53X is filled with the electrolytic copper plating layer 83 at the inner side of the seed layer 82. In the same manner as the wiring layer 52, the wiring layer 54 is formed by the seed layer 82 and the electrolytic copper plating layer 84. The seed layer 82 is formed on the upper surface of the insulation layer 53. The electrolytic copper plating layer 84 is formed on the seed layer 82.

Subsequently, in the steps illustrated in FIGS. 9A and 9B, the insulation layer 55 is formed on the insulation layer 53 through the same steps as illustrated in FIGS. 6C and 7A. The insulation layer 55 is formed on the insulation layer 53. The insulation layer 55 includes the through hole 55X, which exposes a portion of the upper surface of the wiring layer 54. Then, through the same steps as illustrated in FIGS. 7B to 8B, the via wire 59 and the wiring layer 56 are formed, for example, using the semi-additive process. The through hole 55X is filled with the via wire 59. The wiring layer 56 is formed on the insulation layer 55 and electrically connected to the wiring layer 54 by the via wire 59. As illustrated in FIG. 9B, in the same manner as the via wire 57, the via wire 59 is formed by a seed layer 85 and an electrolytic copper plating layer 86. The seed layer 85 is formed in the through hole 55X. The through hole 55X is filled with the electrolytic copper plating layer 87 at the inner side of the seed layer 85. In the same manner as the wiring layer 52, the wiring layer 56 is formed by the seed layer 85 and the electrolytic copper plating layer 87. The seed layer 85 is formed on the upper surface of the insulation layer 55. The electrolytic copper plating layer 87 is formed on the seed layer 85. If necessary, a surface-processed layer may be formed on the wiring layer 56.

Through the manufacturing procedures, the wiring structure 12 is stacked on the upper surface 41A of the insulation layer 41, which is the uppermost layer of the wiring structure 11.

Figure 10A:
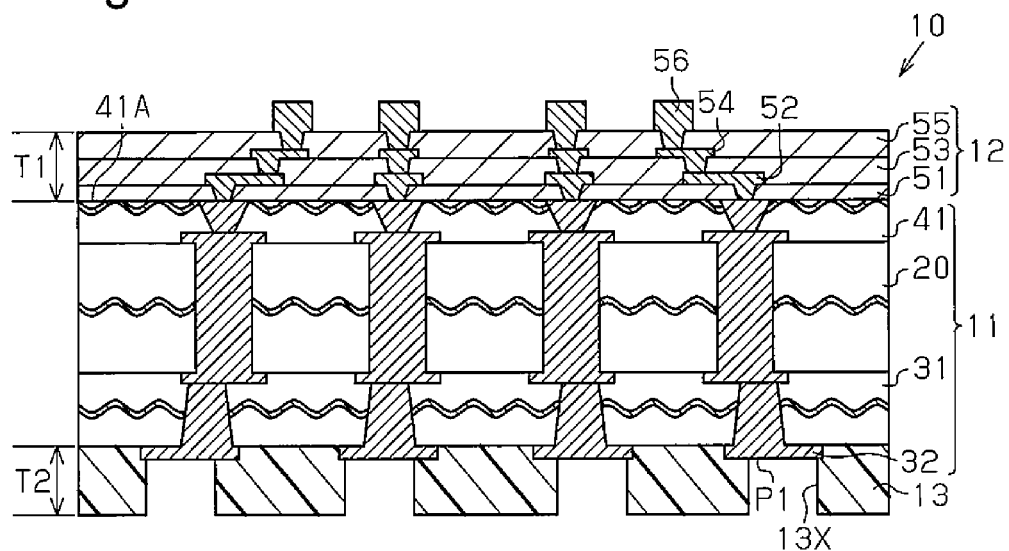

In the step illustrated in FIG. 10A, the solder resist layer 13 is stacked on the lower surface of the insulation layer 31. The solder resist layer 13 includes the opening 13X. The opening 13X exposes an external connection pad P1 bounded in a predetermined location of the wiring layer 32, which is the lowermost layer of the wiring structure 11. The thickness T2 of the solder resist layer 13 (thickness from the lower surface of the insulation layer 31 to the lower surface of the solder resist layer 13) is set to be greater than or equal to the thickness T1 of the wiring structure 12 (thickness from the upper surface 41A of the insulation layer 41 to the upper surface of the insulation layer 55). The solder resist layer 13 may be formed, for example, by stacking a photosensitive solder resist film on the lower surface of the insulation layer 31 or applying a liquid solder resist and pattering the resist into a desirable shape. By the patterning, a portion of the wiring layer 32 is exposed in the opening 13X of the solder resist layer 13 and serves as the external connection pad P1.

If necessary, a surface-processed layer may be formed on the wiring layer 32 exposed in the opening 13X of the solder resist layer 13 (i.e., external connection pad P1). Through the manufacturing procedures, the wiring substrate 10 illustrated in FIG. 1A may be manufactured.

The method for manufacturing the semiconductor package 60 will now be described.

Figure 10B:
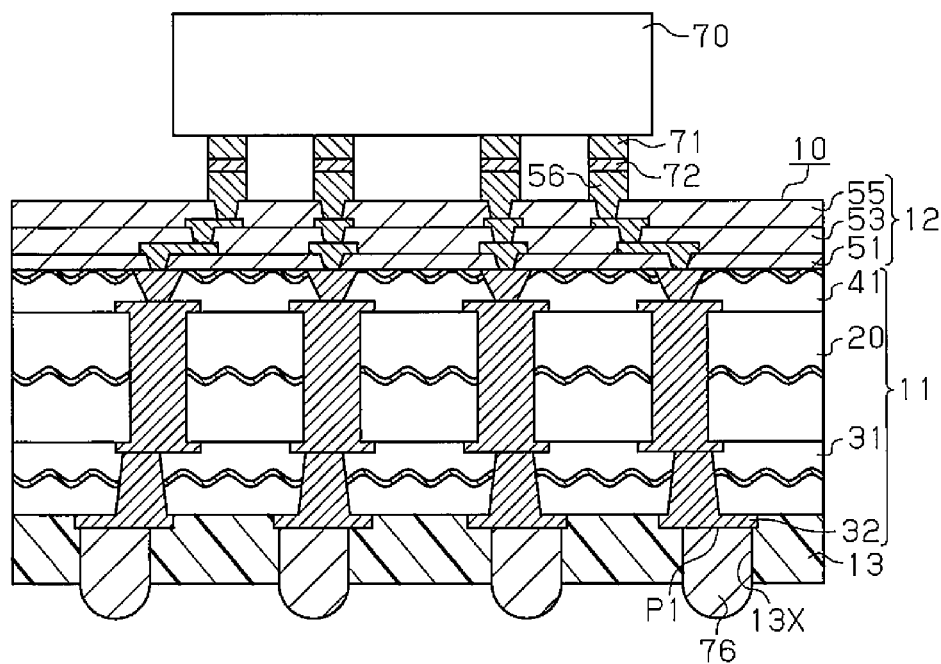
FIG. 10B is a schematic cross-sectional view illustrating a method for manufacturing the semiconductor device of FIG. 3.

In the step illustrated in FIG. 10B, the external connection terminal 76 is formed on the external connection pad P1. For example, after appropriately applying flux to the external connection pad P1, the flux is joined with the external connection terminal 76 (here, solder ball). Then, the external connection terminal 76 is fixed to the external connection pad P1 by performing reflow soldering at approximately 240° C. to 260° C. Subsequently, the unnecessary flux is removed by a surface cleaning process.

Also, in the step illustrated in FIG. 10B, the semiconductor chip 70 including the rod-shaped connection terminal 71 is prepared. The connection terminal 71 may be manufactured through a known manufacturing method, which will not be illustrated in the drawings and described in detail. The connection terminal 71 is manufactured, for example, through the following process.

First, for example, a protection film is formed on the circuit formation surface of the semiconductor chip 70 (here, lower surface). The protection film includes an opening, which exposes an electrode pad. Next, a seed layer is formed so that the lower surfaces of the protection film and the electrode pad are covered. A resist layer is formed so that the seed layer is exposed on a location corresponding to the region where the connection terminal 71 is formed. Then, the electrolytic plating (for example, electrolytic copper plating) is performed using the seed layer exposed on the resist layer as the power supplying layer. This forms the rod-shaped connection terminal 71 on the electrode pad.

The joint member 72 is formed on the lower surface of the connection terminal 71. The joint member 72 may be formed, for example, by applying solder to the lower surface of the connection terminal 71 by the electrolytic solder plating, which uses the resist layer formed on the seed layer as the plating mask and the seed layer as the plating power supplying layer. Subsequently, the unnecessary seed layer and resist layer are removed.

The connection terminal 71 of the semiconductor chip 70 is flip-chip-joined with the wiring layer 56 (pad) of the wiring substrate 10. For example, after the wiring substrate 10 and the semiconductor chip 70 are positioned, a reflow process is performed to melt the joint member 72 (solder plating layer). This electrically connects the connection terminal 71 to the wiring layer 56 (pad).

Figure 3:
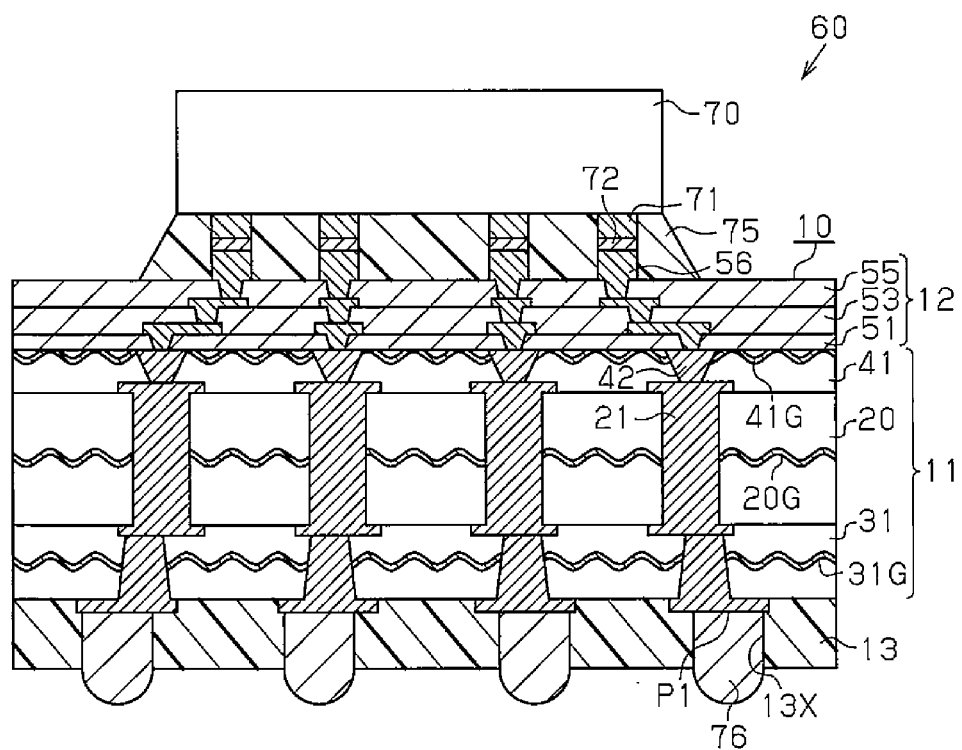
FIG. 3 a schematic cross-sectional view illustrating a semiconductor device including the wiring substrate of FIG. 1A.

A gap between the semiconductor chip 70 and the wiring substrate 10, which are flip-chip-joined, is filled with the underfill resin 75 (refer to FIG. 3). Then, the underfill resin 75 is cured. Through the manufacturing procedures, the semiconductor package 60 illustrated in FIG. 3 may be manufactured.

The present embodiment has the advantages described below.

(1) The insulation layers 31 and 41 formed from the insulative resin containing the reinforcement material are located on the lower surface 20B and the upper surface 20A of the core substrate 20. This sufficiently ensures the rigidity of the wiring substrate 10 even when the thickness of the core substrate 20 is reduced and the insulation layers 31 and 41, which are thinner than the reduced thickness, are stacked on the lower surface 20B and the upper surface 20A of the core substrate 20. Thus, the overall thickness of the wiring substrate 10 may be reduced, and the generation of warpage and undulation may be limited in the wiring substrate 10.

(2) The generation of warpage and undulation is limited in the wiring substrate 10. This limits the delamination of the insulation layer 51 from the insulation layer 41.

(3) The glass cloth 41G, which serves as the reinforcement material of the insulation layer 41, is exposed on and projected from the upper surface 41A of the insulation layer 41. The glass cloth 41G increases the roughness of the upper surface 41A of the insulation layer 41. This improves the adhesion between the insulation layers 41 and 51 and limits the delamination of the insulation layer 51 from the insulation layer 41.

(4) The thickness T2 of the solder resist layer 13 is set to be greater than or equal to the thickness T1 of all of the insulation layers of the wiring structure 12. Consequently, the wiring substrate 10 may have the physical property distribution in the vertical direction (thicknesswise direction) that is substantially symmetric at the portion above the core substrate 20 and the portion below the core substrate 20. This improves the balance of the physical properties at the above portion of the core substrate 20 and the below portion of the core substrate 20 and limits the generation of warpage and undulation in the wiring substrate 10 resulting from thermal shrinkage or the like.

(5) The lowermost wiring layer 52 of the wiring structure 12 is formed on the upper surface 51A (flat and smooth surface) of the insulation layer 51, the main component of which is a photosensitive resin. This allows for the formation of the finer wiring layer 52 than when a wiring layer is formed on the upper surface 41A of the insulation layer 41, which has a greater surface roughness. More specifically, the exposure of the glass cloth 41G on the upper surface 41A of the insulation layer 41 increases the surface roughness of the upper surface 41A. Even in this case, the fine wiring layer 52 may be formed by applying the wiring layer 52 to the upper surface 51A (flat and smooth surface) of the insulation layer 51, which is formed on the upper surface 41A of the insulation layer 41.

(6) In the wiring substrate, when the via wire has a stacked via structure, cracks may be generated in the boundary surface between the via wire and the insulation layer. Such cracks may be generated due to the following reason. For example, when the via wires substantially have the same diameter, the via wires are stacked in a straight line. In other words, the boundary surface between the via wires and the insulation layers extends in a straight line in the stacking direction. In this configuration, when thermal stress is generated due to the difference in the coefficient of thermal expansion between the via wire and the insulation layer, the thermal stress is not easily decreased. This may cause the generation of cracks in the boundary surface between the via wire and the insulation layer, particularly, between the bottom portion of the via wire and the insulation layer. Further, the cracks may cause the delamination in the bottom portion of the via wire.

In the present embodiment of the wiring substrate 10, the via wire 57, which has a smaller diameter than the via wire 42, is stacked immediately above the via wire 42. Therefore, as viewed from above, the boundary surface of the via wire 57 and the insulation layer 51 is located in a position different from the boundary surface of the via wire 42 and the insulation layer 41. In other words, although the via wires 42 and 57 have the stacked via structure, the boundary surface of the via wire 42 and the insulation layer 41 is not aligned with the boundary surface of the via wire 57 and the insulation layer 51 in a straight line in the stacking direction. Thus, when thermal stress is generated due to the difference in the coefficient of thermal expansion between the via wires 42 and 57 and the insulation layers 41 and 51, the thermal stress may be dispersed in a preferred manner. This inhibits the thermal stress from gathering in a portion of the via wires 42 and 57 having the stacked via structure (i.e., bottom portion of the via wire 57). Consequently, the generation of cracks may be limited in the boundary surfaces between the via wire 42 and the insulation layer 41 and between the via wire 57 and the insulation layer 51.

(7) The via wire 42 entirely covers the end portion A1 of the glass cloth 41G projected from the side wall of the through hole 41X toward the inner side of the through hole 41X. That is, the end portion A1 of the glass cloth 41G projects to the via wire 42. This increases the tensile strength of the via wire 42 and improves the connection reliability between the via wire 42 and the insulation layer 41.

It should be apparent to those skilled in the art that the present invention may be embodied in many other specific forms without departing from the scope of the invention. Particularly, it should be understood that the present invention may be embodied in the following forms.

In the above embodiment, the single insulation layer 41 (first insulation layer) is formed on the upper surface 20A of the core substrate 20, and the single insulation layer 31 (second insulation layer) is formed on the lower surface 20B of the core substrate 20. However, there is no limit to such a configuration. Two or more insulation layers may be formed on each of the upper surface 20A and the lower surface 20B of the core substrate 20. In this case, preferably, each insulation layer includes a reinforcement material.

Figure 11:
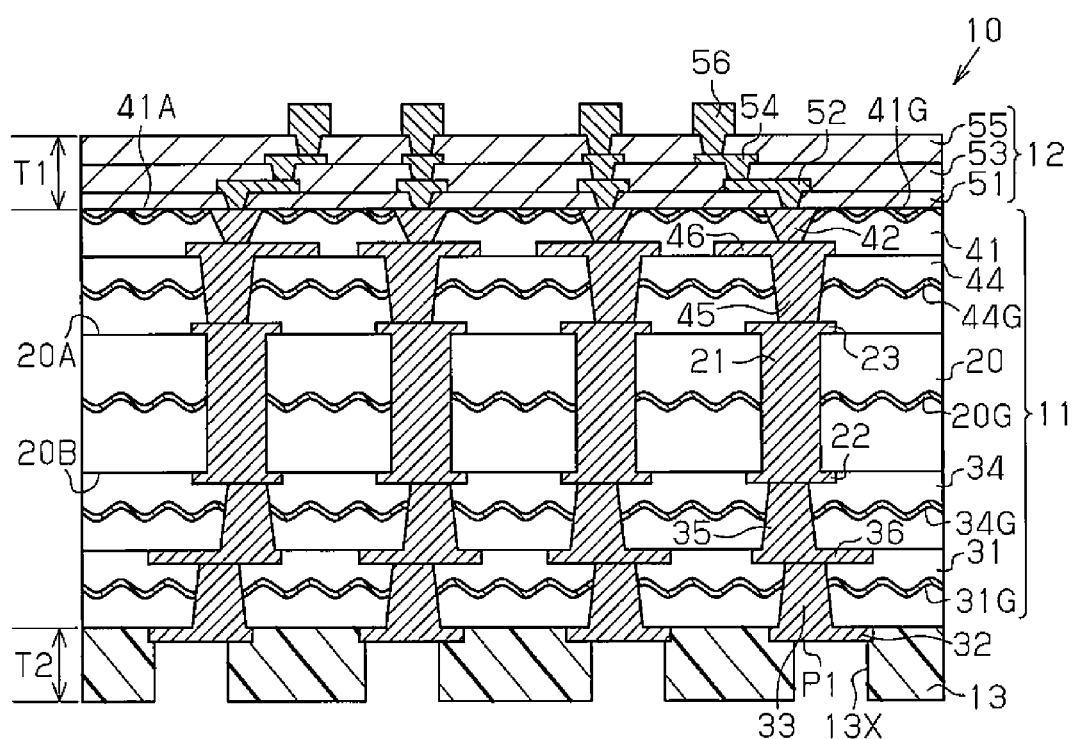
FIG. 11 is a schematic cross-sectional view illustrating a wiring substrate of a modified example.

For example, as illustrated in FIG. 11, the insulation layers 41 and 44, each of which includes a reinforcement material, (first insulation layer) may be stacked on the upper surface 20A of the core substrate 20, and the insulation layers 31 and 34, each of which includes a reinforcement material, (second insulation layer) may be stacked on the lower surface 20B of the core substrate 20. The structure of the wiring structure 11 including the core substrate 20 and the insulation layers 31, 34, 41, and 44 will now be described.

In the same manner as the insulation layers 31 and 41, a thermosetting insulative resin including a reinforcement material may be used as the material of the insulation layers 34 and 44. For example, a glass epoxy resin may be used as the material of the insulation layers 34 and 44. A glass epoxy resin is obtained by impregnating a thermosetting insulative resin, the main component of which is an epoxy resin, in a glass cloth (glass woven cloth) as a reinforcement material and curing the resin.

The insulation layer 34 is stacked on the lower surface 20B of the core substrate 20 to cover the wiring layer 22. A glass cloth 34G is arranged in the middle of the insulation layer 34 in the thicknesswise direction. The glass cloth 34G has the same structure as the glass cloth 41G.

The insulation layer 34 includes a via wire 35, which extends through the insulation layer 34 in the thicknesswise direction. A wiring layer 36 is formed on the lower surface of the insulation layer 34. The wiring layer 36 is electrically connected to the wiring layer 22 by the via wire 35. The insulation layer 31 is stacked on the lower surface of the insulation layer 34 to cover the wiring layer 36. In the same manner as the above embodiment, the insulation layer 31 includes the via wire 33, and the lowermost wiring layer 32 is formed on the lower surface of the insulation layer 31.

The solder resist layer 13, which includes the opening 13X, is formed on the lower surface of the lowermost insulation layer 31.

The insulation layer 44 is stacked on the upper surface 20A of the core substrate 20 to cover the wiring layer 23. A glass cloth 44G is arranged in the middle of the insulation layer 44 in the thicknesswise direction. The glass cloth 44G has the same structure as the glass clothes 41G and 31G.

The insulation layer 44 includes a via wire 45, which extends through the insulation layer 44 in the thicknesswise direction. A wiring layer 46 is formed on the upper surface of the insulation layer 44. The wiring layer 46 is electrically connected to the wiring layer 23 by the via wire 45. The insulation layer 41 is formed on the upper surface of the insulation layer 44 to cover the wiring layer 46. In the same manner as the above embodiment, the insulation layer 41 includes the via wire 42.

The wiring structure 12 is stacked on the upper surface 41A of the uppermost insulation layer 41. The glass cloth 41G is partially exposed on the upper surface 41A of the insulation layer 41.

The structure of FIG. 11 has the same advantages as the above embodiment.

In the above embodiment and modified examples, the thickness of the solder resist layer 13 is greater than or equal to the thickness of the wiring structures 12. Instead, for example, the thickness of the solder resist layer 13 may be smaller than the thickness of the wiring structures 12.

In the above embodiment and modified examples, the insulation layer 41 is thinner than the insulation layer 31. Instead, for example, the insulation layers 41 and 31 may have the same thickness.

In the above embodiment and modified examples, the upper end surface 42A of the via wire 42 is flush with the upper surface 41A of the insulation layer 41. Instead, for example, the upper end surface 42A of the via wire 42 may be recessed and located lower than the upper surface 41A of the insulation layer 41.

In the wiring structure 11 of the above embodiment and modified examples, wiring manners and the number of the wiring layers 22, 23, 32, 36, and 46, the via wires 35, 33, 42, and 45, and the insulation layers 31, 34, 41, and 44 may be variously modified or changed.

In the wiring structure 12 of the above embodiment and modified examples, wiring manners and the number of the wiring layers 52, 54, and 56, the via wires 57 to 59, and the insulation layers 51, 53, and 55 may be variously modified or changed.

In the above embodiment, the cross-sectional shape of each of the via wires 33, 35, 42, 45, and 57 to 59 is not particularly limited. For example, the via wires 33, 35, 42, 45, and 57 to 59 may have tetragonal cross-sections (straight shape).

In the above embodiment, a different semiconductor device (semiconductor package) may be stacked on the semiconductor device 60.

Clauses

This disclosure further encompasses various embodiments described below.

1. A method for manufacturing a wiring substrate, the method including:

preparing a core substrate;

stacking a first insulation layer on an upper surface of the core substrate, wherein the first insulation layer is formed from a thermosetting insulative resin including a first reinforcement material;

stacking a second insulation layer on a lower surface of the core substrate, wherein the second insulation layer is formed from a thermosetting insulative resin including a second reinforcement material;

forming a first through hole that extends through the first insulation layer in a thicknesswise direction;

forming a conductive layer that fills the first through hole and covers an upper surface of the first insulation layer;

polishing the conductive layer and the upper surface of the first insulation layer so that the first reinforcement material is partially exposed on the upper surface of the first insulation layer and so that a via wire, which includes an upper end surface exposed on the upper surface of the first insulation layer, is formed in the first through hole;

stacking a second wiring structure, which includes a third insulation layer and a wiring layer, on the upper surface of the first insulation layer, wherein the main component of the third insulation layer is a photosensitive resin; and stacking an outermost insulation layer on a lower surface of the second insulation layer, wherein the main component of the outermost insulation layer is a photosensitive resin.

2. The method according to clause 1, wherein
the third insulation layer is stacked on the upper surface of the first insulation layer and the upper end surface of the via wire to cover the first reinforcement material exposed on the upper surface of the first insulation layer, and the wiring layer is formed in a second through hole, which extends through the third insulation layer in the thicknesswise direction to expose the upper end surface of the via wire, and electrically connected to the via wire.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a first wiring structure that includes
a core substrate,
a first insulation layer stacked on an upper surface of the core substrate and formed from a thermosetting insulative resin including a first reinforcement material,
a second insulation layer stacked on a lower surface of the core substrate and formed from a thermosetting insulative resin including a second reinforcement material, and
a via wire formed in the first insulation layer;
a second wiring structure that includes
a third insulation layer formed on an upper surface of the first insulation layer and an upper end surface of the via wire, wherein the main component of the third insulation layer is a photosensitive resin, and
a wiring layer formed on the third insulation layer and extending through the third insulation layer to be electrically connected to the upper end surface of the via wire; and
an outermost insulation layer stacked on a lower surface of the second insulation layer, wherein the main component of the outermost insulation layer is a photosensitive resin, wherein
the second wiring structure has a higher wiring density than the first wiring structure, and
the first reinforcement material of the first insulation layer is partially exposed on and projected from the upper surface of the first insulation layer.

2. The wiring substrate according to claim 1, wherein
the first insulation layer is thinner than the second insulation layer,
the third insulation layer of the second wiring structure is a lowermost third insulation layer of a plurality of third insulation layers, for each of which the main component is a photosensitive resin, wherein the plurality of third insulation layers are sequentially stacked on the upper surface of the first insulation layer, and the lowermost third insulation layer is formed directly on both of the upper surface of the first insulation layer and the upper end surface of the via wire, the wiring layer of the second wiring structure is a lowermost wiring layer of a plurality of wiring layers, wherein each of the plurality of wiring layers is formed on an upper surface of one of the plurality of third insulation layers, and the lowermost wiring layer is formed directly on the upper surface of the lowermost third insulation layer and extending through the lowermost third insulation layer to be directly and electrically connected to the upper end surface of the via wire, and the outermost insulation layer is stacked directly on the lower surface of the second insulation layer.

3. The wiring substrate according to claim 1, wherein
the first insulation layer includes a first through hole extending through the first insulation layer in a thicknesswise direction, wherein the first through hole is filled with the via wire, and the upper end surface of the via wire is flush with the upper surface of the first insulation layer.

4. The wiring substrate according to claim 1, wherein
the third insulation layer covers the first reinforcement material exposed on and projected from the upper surface of the first insulation layer, the third insulation layer includes a second through hole extending through the third insulation layer in the thicknesswise direction, wherein the second through hole is filled with the wiring layer, and the wiring substrate further comprises a seed layer that electrically connects the wiring layer and the upper end surface of the via wire.

5. The wiring substrate according to claim 1, wherein
the first insulation layer includes a resin layer, and
the first reinforcement material partially projects from an upper surface of the resin layer of the first insulation layer.

6. The wiring substrate according to claim 5, wherein
the upper surface of the first insulation layer includes
a first irregularity portion formed by the upper surface of the resin layer and the first reinforcement material which partially projects from the upper surface of the resin layer, and
a second irregularity portion formed in a surface of the first reinforcement material that partially projects from the upper surface of the resin layer.

7. The wiring substrate according to claim 1, wherein
the second wiring structure includes one or more insulation layers, and
the outermost insulation layer has a thickness that is greater than or equal to a total thickness of all of the insulation layers of the second wiring structure.

8. A semiconductor device comprising:
the wiring substrate according to claim 1; and
a semiconductor chip flip-chip-mounted on an uppermost wiring layer of the second wiring structure.

9. A wiring substrate comprising:
a first wiring structure that includes
a core substrate,
a plurality of first insulation layers stacked on an upper surface of the core substrate, wherein each of the first insulation layers is formed from a thermosetting insulative resin including a first reinforcement material, and
a plurality of second insulation layers stacked on a lower surface of the core substrate, wherein each of the second insulation layers is formed from a thermosetting insulative resin including a second reinforcement material;

a second wiring structure that includes
    a plurality of insulation layers, each of which the main component is a photosensitive resin, and
    a plurality of wiring layers,
        wherein the second wiring structure is stacked on an upper surface of the uppermost one of the first insulation layers; and
an outermost insulation layer stacked on a lower surface of the lowermost one of the second insulation layers, wherein the main component of the outermost insulation layer is a photosensitive resin, wherein
the second wiring structure has a higher wiring density than the first wiring structure, and
the first reinforcement material included in the uppermost first insulation layer is partially exposed on and projected from the upper surface of the uppermost first insulation layer.

10. The wiring substrate according to claim 9, wherein
the first wiring structure further includes a via wire formed in an uppermost first insulation layer of the plurality of first insulation layers,
the plurality of insulation layers of the second wiring structure are sequentially stacked on an upper surface of the uppermost first insulation layer,
the plurality of insulation layers of the second wiring structure include a lowermost insulation layer formed directly on both of the upper surface of the uppermost first insulation layer and an upper end surface of the via wire,
each of the plurality of wiring layers of the second wiring structure is formed on an upper surface of one of the plurality of insulation layers of the second wiring structure, and
the outermost insulation layer is stacked directly on the lower surface of the lowermost one of the second insulation layers.

11. The wiring substrate according to claim 10, wherein
the uppermost first insulation layer includes a first through hole extending through the uppermost first insulation layer in a thicknesswise direction, wherein the first through hole is filled with the via wire, and
the upper end surface of the via wire is flush with the upper surface of the uppermost first insulation layer.

12. The wiring substrate according to claim 10, wherein
the lowermost insulation layer of the plurality of insulation layers of the second wiring structure covers the first reinforcement material exposed on and projected from the upper surface of the uppermost first insulation layer,
the lowermost insulation layer of the plurality of insulation layers of the second wiring structure includes a second through hole extending through the lowermost insulation layer in a thicknesswise direction, wherein the second through hole is filled with a lowermost wiring layer of the plurality of wiring layers, and
the wiring substrate further comprises a seed layer that electrically connects the lowermost wiring layer and the upper end surface of the via wire.

13. The wiring substrate according to claim 9, wherein
the uppermost first insulation layer includes a resin layer, and
the first reinforcement material partially projects from an upper surface of the resin layer of the uppermost first insulation layer.

14. The wiring substrate according to claim 13, wherein
the upper surface of the uppermost first insulation layer includes
    a first irregularity portion formed by the upper surface of the resin layer and the first reinforcement material which partially projects from the upper surface of the resin layer, and
    a second irregularity portion formed in a surface of the first reinforcement material that partially projects from the upper surface of the resin layer.

15. The wiring substrate according to claim 9, wherein
the outermost insulation layer has a thickness that is greater than or equal to a total thickness of all of the plurality of insulation layers of the second wiring structure.

* * * * *